(12) United States Patent  (10) Patent No.: US 8,575,643 B2
Watanabe et al.  (45) Date of Patent: Nov. 5, 2013

(54) LIGHT-EMITTING DEVICE

(75) Inventors: Yoshiaki Watanabe, Kanagawa (JP);
Tomonori Hino, Kanagawa (JP);
Nobukata Okano, Kanagawa (JP);
Hisayoshi Kuramochi, Kanagawa (JP);
Tatsuo Ohashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 599 days.

(21) Appl. No.: 11/876,909

(22) Filed: Oct. 23, 2007

(65) Prior Publication Data

US 2008/0105885 A1    May 8, 2008

(30) Foreign Application Priority Data

Oct. 24, 2006  (JP) ................................. 2006-288422

(51) Int. Cl.
*H01L 33/00* (2010.01)

(52) U.S. Cl.
USPC .............. 257/99; 257/E33.062; 257/E33.065; 257/E33.066

(58) Field of Classification Search
USPC ...................... 257/92, E33.025, E27.012, 99, 257/E33.062, E33.065, E33.066
See application file for complete search history.

(56) References Cited

U.S. PATENT DOCUMENTS

| | | | | |
|---|---|---|---|---|
| 3,968,399 A | * | 7/1976 | Jarrett | 372/38.02 |
| 5,065,006 A | * | 11/1991 | Nakamura et al. | 250/208.1 |
| 5,309,001 A | * | 5/1994 | Watanabe et al. | 257/99 |
| 5,977,565 A | * | 11/1999 | Ishikawa et al. | 257/81 |
| 6,380,564 B1 | * | 4/2002 | Chen et al. | 257/99 |
| 6,667,529 B2 | * | 12/2003 | Takagi | 257/488 |
| 6,885,036 B2 | * | 4/2005 | Tarsa et al. | 257/99 |
| 2003/0038294 A1 | * | 2/2003 | Sano | 257/91 |
| 2006/0157718 A1 | * | 7/2006 | Seo et al. | 257/82 |
| 2006/0163604 A1 | * | 7/2006 | Shin et al. | 257/103 |
| 2009/0278143 A1 | * | 11/2009 | Shakuda | 257/93 |

FOREIGN PATENT DOCUMENTS

| | | |
|---|---|---|
| JP | 60-003680 | 1/1985 |
| JP | 05-267494 | 10/1993 |
| JP | 06-151964 | 5/1994 |
| JP | 1998-135519 | 5/1998 |
| JP | 10135519 A * | 5/1998 |

(Continued)

OTHER PUBLICATIONS

A Japanese Office Action dated Oct. 7, 2008 issued in connection with counterpart Japanese Patent Application No. 2006-288422.

(Continued)

*Primary Examiner* — Wael Fahmy
*Assistant Examiner* — Sarah Salerno
(74) *Attorney, Agent, or Firm* — Dentons US LLP

(57) ABSTRACT

A light-emitting device includes a first compound semiconductor layer, an active layer, and a second compound semiconductor layer; a second electrode formed on the second compound semiconductor layer; an insulating layer covering the second electrode; a first opening provided to pass through the insulating layer, the second electrode, the second compound semiconductor layer, and the active layer; a second opening provided to pass through the insulating layer; a first electrode formed on an exposed portion of the first compound semiconductor layer at the bottom of the first opening; a first electrode extension extending from the first electrode to the insulating layer through the first opening and a first pad portion including a portion of the first electrode extension on the insulating layer; and a second pad portion connected to an exposed portion of the second electrode at the bottom of the second opening.

28 Claims, 15 Drawing Sheets

(56) References Cited

FOREIGN PATENT DOCUMENTS

| JP | 30608914 | 1/2000 |
| JP | 2000-216442 | 8/2000 |
| JP | 2004-079785 | 3/2004 |
| JP | 2006-019347 | 1/2006 |
| JP | 2006-100529 | 4/2006 |

OTHER PUBLICATIONS

Japanese Office Action dated Jun. 24, 2008 for Application No. 2006-288422.

* cited by examiner

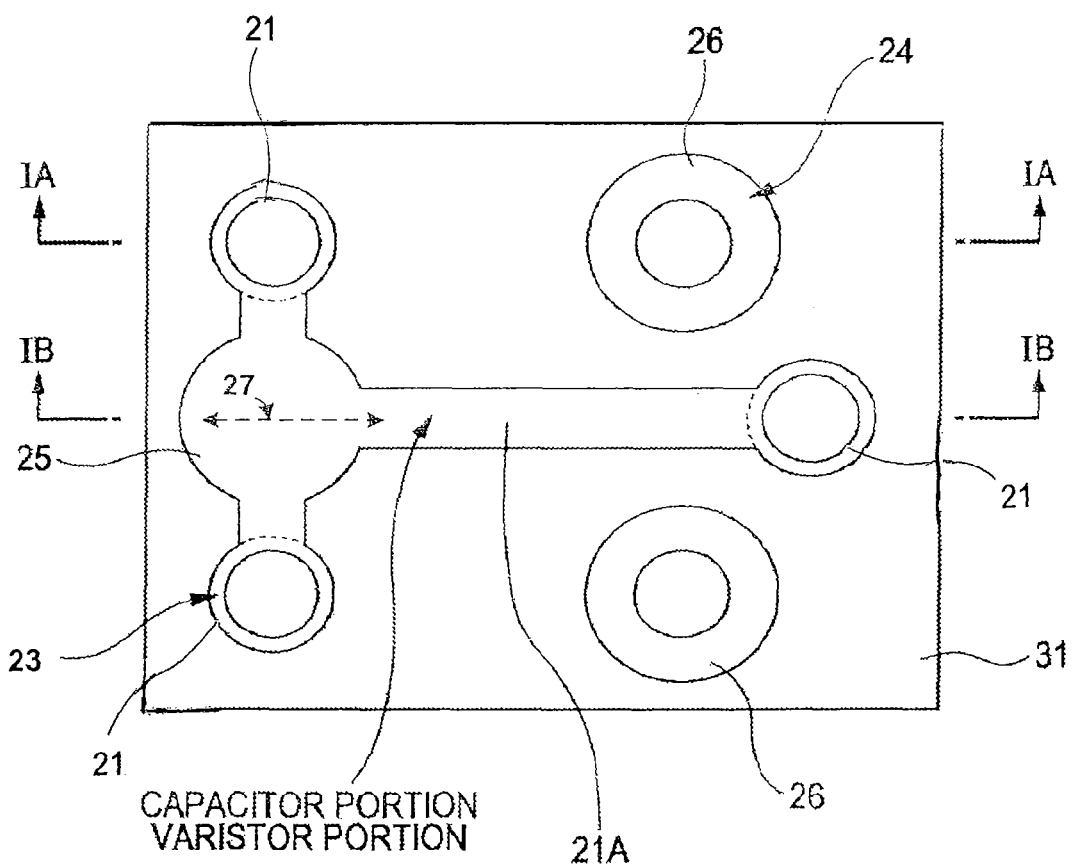

[STEP-130]

[STEP-140]

[STEP-150]

[STEP-160]

[STEP-160] (CONTINUED)

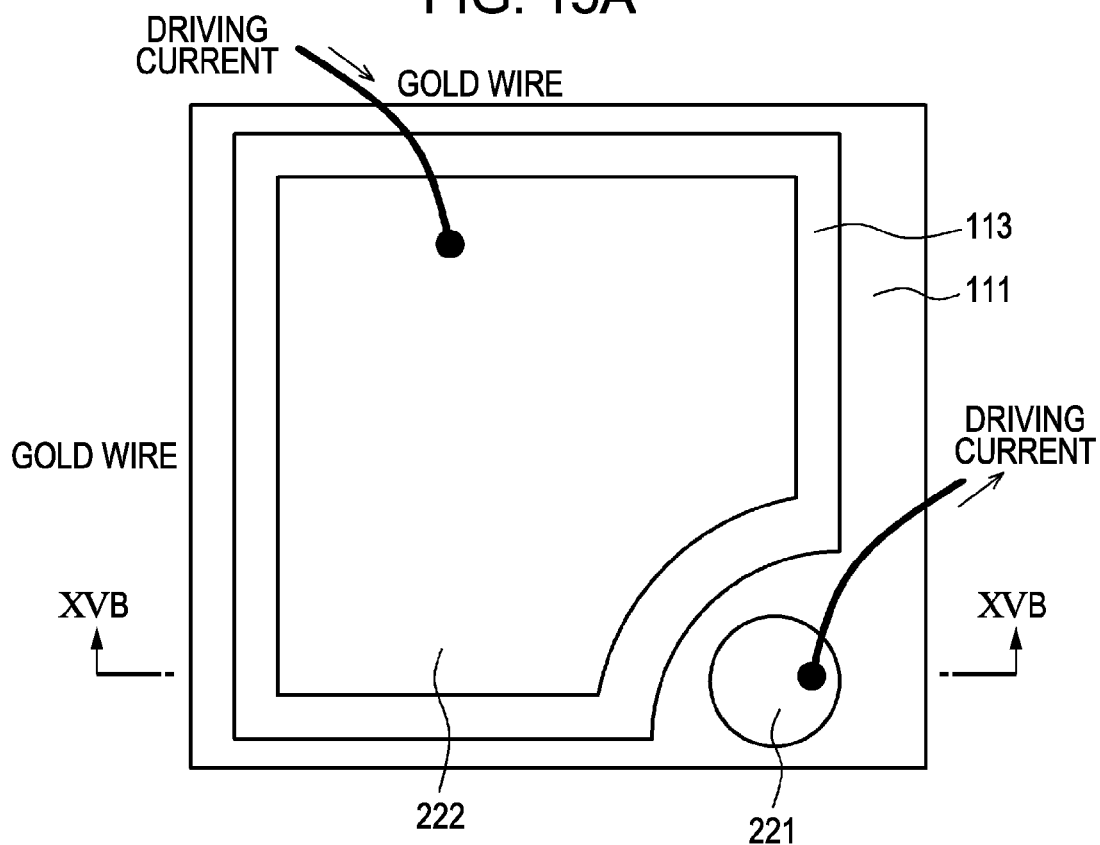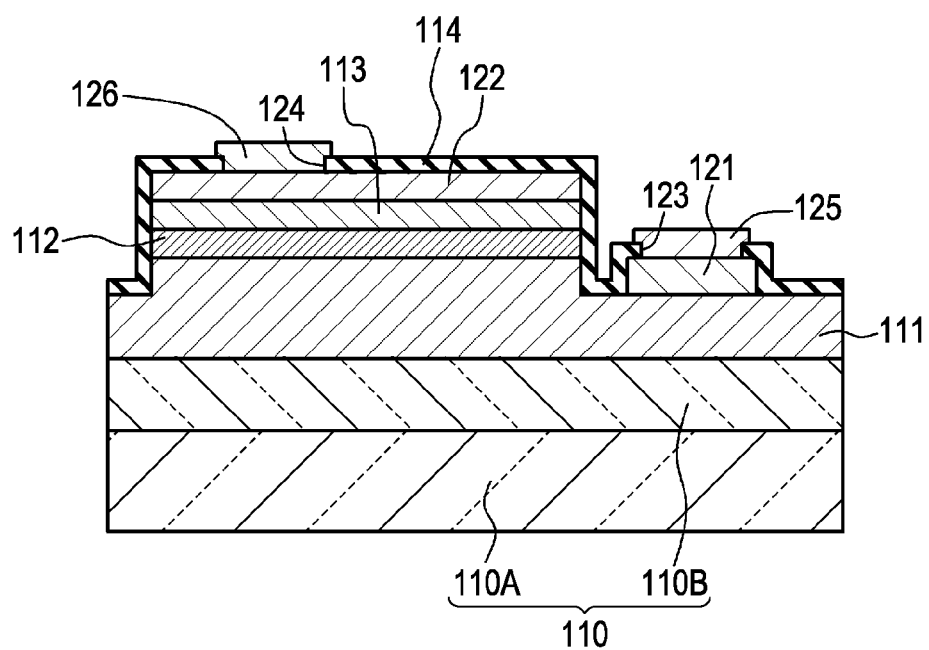

LIGHT-EMITTING DEVICE

CROSS REFERENCES TO RELATED APPLICATIONS

The present invention contains subject matter related to Japanese Patent Application JP 2006-288422 filed in the Japanese Patent Office on Oct. 24, 2006, the entire contents of which are incorporated herein by reference.

BACKGROUND OF THE INVENTION

1. Field of the Invention

The present invention relates to a light-emitting device.

2. Description of the Related Art

FIG. 15A is a schematic drawing showing an arrangement of components in a general light-emitting diode (LED) disclosed in, for example, Japanese Utility Model Registration No. 3068914 and FIG. 15B is a schematic sectional view taken along line B-B in FIG. 15A. As shown in FIGS. 15A and 15B, the light-emitting diode includes a substrate 110A made of, for example, sapphire, an underlying layer 110B formed by, for example, a MOCVD method (Metal-Organic Chemical Vapor Deposition) method, and a luminescent layer formed on the substrate 110A and having a laminated structure in which a first compound semiconductor layer 111 of a first conductivity type (e.g., n type), an active layer 112 having a quantum well structure, and a second compound semiconductor layer 113 of a second conductivity type (e.g., p type) are laminated. Also a second electrode (p-side electrode) 122 is provided on the second compound semiconductor layer 113. Further, the second compound semiconductor layer 113 and the active layer 112 are partially removed to expose a portion of the first compound semiconductor layer 111, and a first electrode (n-side electrode) 121 is provided on the exposed portion of the first compound semiconductor layer 111. A current flows from the second electrode (p-side electrode) 122 to the first compound semiconductor layer 111 and the first electrode 121 (n-side electrode) through the active layer 111 provided immediately below the remaining portion of the second compound semiconductor layer 113. As a result, in the active layer 112, the quantum well structure is excited by injection of the current to cause a luminescent state over the entire surface.

In a light-emitting diode of a type in which light is emitted from the substrate side, light from the active layer 112 is emitted directly to the outside through the substrate 110A or reflected by the second electrode 122 and then emitted to the outside through the substrate 110A. As a material for forming the second electrode 122, for example, silver (Ag) having high reflectance is used. In order to improve the reliability of the second electrode 122, the second electrode 122 is generally covered with an insulating film 114 by a CVD method such as plasma CVD or a PVD method such as vacuum deposition or sputtering. The insulating film 114 has openings 123 and 124 provided above the first and second electrodes 121 and 122, respectively, and first and second pads 125 and 126 are provided on the exposed portions of the first and second electrodes 121 and 122, respectively.

Another light-emitting device known from Japanese Unexamined Patent Application Publication No. 2006-19347 includes a semiconductor light emitting element having n and p electrodes provided on a plane and a mount member for flip-chip connecting the semiconductor light-emitting element, the n electrodes of the semiconductor light emitting elements being formed at the vertexes of a substantially regular triangle, and the p-electrode being formed to surround at least one n electrode.

SUMMARY OF THE INVENTION

In the light-emitting diode with the above-described structure, in order to efficiently emit light, it is important to design the first electrode (n-side electrode) 121 so as to minimize the area (width) thereof and prevent deterioration in electric characteristics in consideration of the structure and constitution (composition and carrier concentration) of each compound semiconductor layer, the relation between the current flow and spreading, and contact resistance. Also, in order to achieve the light-emitting diode with higher luminance, it is important to increase the area of the luminescent layer. In the light-emitting diode having determined outer dimensions, the area of the luminescent layer can be increased by decreasing the area of the first electrode (n-side electrode) 121.

On the other hand, in view of the requirements of the step of assembling the light-emitting diode (assembling on a circuit board or a package base), it is required that the pad portions (first pad and second pad portions 125 and 126) have a size not applying a large load on a wire bonding step and a die bonding step (not decreasing mechanical strength or degrading mounting properties). This requirement is contrary to the requirement for decreasing the area of the first electrode (n-side electrode) 121.

Therefore, the first electrode (n-side electrode) is generally decreased in size as much as possible while securing the minimum pad area having no influence on mounting and is disposed to minimize the space between the first electrode and the second electrode (p-side electrode). Therefore, when a high electric field such as static electricity is applied to the light-emitting diode, the high electric field is applied directly to the compound semiconductor layers and the space between the first and second electrodes. Thus, the voltage endurance characteristics of these layers are an important factor which determines the electrostatic breakdown strength of the light emitting diode.

Nitride compound semiconductors known as constituent materials for a blue light-emitting diode and a green light-emitting diode easily cause many displacements due to lattice mismatch because there is no complete substrate in comparison with lattice matching-type compound semiconductors, such as GaAs compound semiconductors and InP compound semiconductors, which can form grown crystal layers having the same crystal lattice constants as those of a substrate. As a result, the active layer (luminescent layer) is easily affected by defects due to displacements and becomes electrically and mechanically vulnerable.

Because of the above-mentioned factors, it is generally very difficult to improve the electrostatic breaking strength of a light-emitting diode using a nitride compound semiconductor and, at the same time, manufacture the light-emitting diode in high yield.

In order to prevent electrostatic breakage, there have been proposed a method of inserting another light-emitting diode parallel to a main light-emitting diode in the opposite direction, for decreasing the electrostatic voltage/current applied to the main light-emitting diode; a method of inserting a Zener diode in parallel with a light-emitting diode; a method of connecting a chip-type multilayer varistor in parallel with a light-emitting diode. However, in these methods, an element is incorporated in a light-emitting diode, thereby inevitably significantly increasing the cost. In particular, in a lighting system, a backlight for a liquid crystal display device, and a light-emitting diode display device, each of which includes many light-emitting diodes, it is very difficult to use the methods.

In a light-emitting device disclosed in Japanese Unexamined Patent Application Publication No. 2006-19347, the n-electrode and the p-electrode constituting a semiconductor light-emitting element are provided on a surface, and the p-electrode is formed to surround the n-electrode. Therefore, it is difficult to improve low electrostatic breakdown resistance due to vulnerability of the crystal structure, such as crystal defects inevitably contained in a wafer (substrate) surface.

Accordingly, it is desirable to provide a light-emitting device having the high function to prevent electrostatic breakdown and also having a constitution and structure which can minimize the area of a first electrode (n-side electrode) without deteriorating electric properties, and which does not apply a large load on an assembly process.

A light-emitting device according to an embodiment of the present invention includes (A) a first compound semiconductor layer of a first conductivity type, an active layer, and a second compound semiconductor layer of a second conductivity type different from the first conductivity type, (B) a second electrode formed on the second compound semiconductor layer, (C) an insulating layer covering the second electrode, (D) a first opening provided to pass through the insulating layer, the second electrode, the second compound semiconductor layer, and the active layer and to expose the first compound semiconductor layer at the bottom, (E) a second opening provided to pass through the insulating layer and expose the second electrode at the bottom thereof, (F) a first electrode formed on the exposed portion of the first compound semiconductor layer at the bottom of the first opening, (G) a first electrode extension extending from the first electrode to the insulating layer through the first opening and a first pad portion including a portion of the first electrode extension on the insulating layer, and (H) a second pad portion connected to the exposed portion of the second electrode at the bottom of the second opening.

In the light-emitting device according to the embodiment of the present invention, the first electrode extension extends from the first electrode to the top of the insulating layer through the first opening. However, the first electrode extension and the first electrode may be made of different members or an integrated member. Also the first pad portion includes a portion of the first electrode extension, but the first pad portion and the first electrode extension may be made of different members or an integrated member. Further, the second pad portion is connected to the exposed portion of the second electrode at the bottom of the second opening, i.e., the second pad portion is connected to the second electrode and provided in the second opening. However, the second pad portion may be provided from the second electrode to the sidewall of the second opening or provided to extend from the second electrode to the top of the insulating layer through the second opening. In order to further improve the reliability in a wire bonding step and a die bonding step, for example, a plating layer may be formed on the first pad portion and the second pad portion.

In the light-emitting device according to the embodiment of the present invention, a first electrode or a plurality of first electrodes may be provided. In the former case, the first electrode is preferably provided in a region corresponding to the center of the light-emitting device from the viewpoint of uniformity of a current flow.

On the other hand, a plurality of first electrodes is preferably arranged in rotational symmetry with respect to a normal line (axis line) passing through the center of the light-emitting device or arranged in symmetry with respect to a virtual plane including the normal line (axis line). Alternatively, in the latter case, the first electrode extensions extending from the plurality of first electrodes are preferably, but not limited to be, combined to form a first pad portion and a plurality of second pad portions is preferably provided. In this case, two second pad portions are provided and are preferably arranged in symmetry with respect to a virtual plane passing through the center of the first pad portion and including a normal line (axis line) passing through the center of the light-emitting device. In this constitution, the position of the light-emitting device can be maintained with high stability when the light-emitting device is assembled. The size of the first electrode is preferably decreased as much as possible from the viewpoint of higher luminance of the light-emitting device but is preferably increased as much as possible from the viewpoint of contact resistance. From the viewpoint of contact resistance, the area per first electrode is preferably $1\times10^{-7}$ cm$^2$ or more and more preferably $4\times10^{-6}$ cm$^2$ or more. The area per first electrode may be determined according to the number of the electrodes, contact resistance, current spreading (sheet resistance), and luminance required for the light-emitting device.

In the light-emitting device having the above-mentioned preferred constitution according to the embodiment of the present invention, the distance ($L_1$) from the center of a first electrode to the center of the first electrode closest thereto is preferably $3\times10^{-4}$ m (300 μm) or less. Since the lower limit of the distance $L_1$ is determined depending on the structure and size of the light-emitting device, the number of the first electrodes, and the ease of practice of a process (if there is a large number of first electrodes, for example, the shape of the first electrode extensions is complicated to easily cause a problem), the lower limit cannot be defined directly and exclusively.

In the light-emitting device having the above-mentioned preferred constitution according to the embodiment of the present invention, the insulating layer may include a first portion provided between the first electrode extension and the second electrode and a second portion provided on the other region.

In this case, the dielectric constant $\in$ of at least the material constituting the first portion of the insulating layer is preferably $1\times10^1$ (10) or more. At least the first portion of the insulating layer may be formed in a multilayer structure. In this case, among the materials constituting the multilayer structure, the dielectric constant $\in$ of the material having the highest dielectric constant $\in$ is preferably $1\times10^1$ (10) or more. The material constituting at least the first portion of the insulating layer is preferably at least one selected from the group consisting of titanium oxide (TiO$_2$, dielectric constant $\in$ about 100), lead-based relaxer ceramics, and TiO$_3$-based ceramics. Alternatively, the capacity of a capacitor formed by the first electrode extension disposed on the insulating layer, the first portion of the insulating layer, and the second electrode is preferably $1\times10^{-12}$ F (1 pF) or more. According to circumstances, the dielectric constant $\in$ and constituent material of the second portion of the insulating layer may be the same as those of the first portion of the insulating layer. Namely, the first and second portions of the insulating layer can be formed at the same time using the same material. However, as described below, the first and second portions of the insulating layer may be made of different materials.

Examples of lead-based relaxer ceramics include Pb(Zn, Nb, Fe, W, Mg, Ni)O$_3$, PbTiO$_3$, and Pb$_5$Ge$_3$O$_{11}$. Examples of TiO$_3$-based ceramics include barium titanate (BaTiO$_3$, dielectric constant ∈ 1500 to several tens of thousands), $SrTiO_3$, $CaTiO_3$, and $Bi_4Ti_3O_{12}$.

When the insulating layer includes the first portion and the second portion as described above, the first portion may include a semiconductor ceramic layer so that the first electrode extension disposed on the insulating layer, the first portion of the insulating layer, and the second electrode may constitute a varistor portion. In this case, the material constituting the semiconductor ceramic layer is preferably at least one selected from the group consisting of zinc oxide (ZnO), strontium titanate ($SrTiO_3$), and silicon carbide (SiC). The varistor is a two-terminal element in which the resistance nonlinearly decreases as the applied voltage increases. In other words, the varistor is a two-terminal element in which the resistance is high and substantially equal to that of an insulator up to the breakdown voltage but rapidly decreases when the applied voltage exceeds the breakdown voltage to create a substantially conductive state. The method for forming the semiconductor ceramic layer can be exemplified by a PVD method such as a sputtering method, and a hydrothermal method (a method of electrochemically depositing a layer using metal ions in a alkali solution) disclosed in, for example, Japanese Unexamined Patent Application Publication No. 5-299210.

In the light-emitting device having the above-mentioned preferred constitution according to the embodiment of the present invention, the material constituting the second portion of the insulating layer can be exemplified by SOG (Spin On Glass). In this case, the first and second portions of the insulating material are made of different materials. SOG will be described latter. Other examples of the material constituting the second portion of the insulating layer include $SiO_x$-based materials, $SiN_y$-based materials, $SiO_xN_y$-based materials, $Ta_2O_5$, $ZrO_2$, AlN, and $Al_2O_3$. As the forming method, a PVD method such as a vacuum deposition method or a sputtering method or a CVD method can be used.

The light-emitting device having the above-mentioned preferred constitution according to the embodiment of the present invention may further include a first discharge electrode portion extending from the first electrode extension on the insulating layer and a second discharge electrode portion extending from the second pad portion on the insulating layer, the ends of the first and second discharge electrode portions being opposed to each other to form a discharge gap. In this constitution, the ends of the first and second discharge electrode portions have the function as a so-called discharge tube. In this case, the first and second discharge electrode portions are preferably composed of a refractory metal material (e.g., tungsten, molybdenum, tantalum, or platinum), or graphite. The distance of the discharge gap (the distance between the ends of the first and second discharge electrode portions) is preferably 10 μm or less.

In the light-emitting device having the above-mentioned preferred constitution according to the embodiment of the present invention, the insulating layer may extend on the sidewall of the first opening, and the first electrode extension may extend from the first electrode to the top of the insulating layer through the insulating layer extension on the sidewall of the first opening.

In the light-emitting device having the above-mentioned preferred constitution according to the embodiment of the present invention, the first compound semiconductor layer, the active layer, and the second compound semiconductor layer may be composed of a group III-V compound semiconductor containing at least gallium as a group III element and at least nitrogen as a group V element, for example, a GaN-based compound semiconductor (including an AlGaN mixed crystal, an AlInGaN mixed crystal, or an InGaN mixed crystal). However, the material is not limited to this, and other examples of the material include InN-based compound semiconductors, AlN-based compound semiconductors, AlGaInP-based compound semiconductors, AlGaInAs-based compound semiconductors, GaInAs-based compound semiconductors, GaInAsP-based compound semiconductors, GaP-based compound semiconductors, and InP-based compound semiconductors. The method for forming (depositing) the first compound semiconductor layer, the active layer, and the second compound semiconductor layer can be exemplified by a metal-organic chemical vapor deposition method (MOCVD method), a molecular beam epitaxial method (MBE method), and a halide vapor deposition method in which halogen contributes to transport or reaction. Examples of the light-emitting device include a light-emitting diode (LED) and a semiconductor laser. When the light-emitting device includes a light-emitting diode, the light-emitting diode is of a substrate-side emission type in which light from the active layer directly passes through the first compound semiconductor layer or further passes through the substrate described below and is then emitted to the outside, or is reflected by the second electrode, passes through the first compound semiconductor layer or further passes through the substrate described below, and is then emitted to the outside. As described below, when the second electrode is composed of, for example, silver (Ag) or a silver alloy, a light reflectance of 96% or more can be achieved.

In the light-emitting device having the above-mentioned preferred constitution according to the embodiment of the present invention (may be simply generally named "the present invention" hereinafter), a capacitor portion, a varistor portion, or a discharge gap is formed. These portions may be formed alone or in combination of two or more. Namely, there can be exemplified the seven cases, i.e., a capacitor portion alone, a varistor portion alone, a discharge gap alone, combination of a capacitor portion and a varistor portion, combination of a capacitor portion and a discharge gap, combination of a varistor portion and a discharge gap, and combination of a capacitor portion, a varistor portion, and a discharge gap.

In the present invention, the first compound semiconductor layer, the active layer, and the second compound semiconductor layer are formed on the substrate or the first compound semiconductor layer, the active layer, and the second compound semiconductor layer are formed on the substrate in the course of the process for manufacturing the light-emitting device. Examples of the substrate include a sapphire substrate, a GaAs substrate, a GaN substrate, a SiC substrate, an alumina substrate, a ZnS substrate, a ZnO substrate, an AlN substrate, a LiMgO substrate, a $LiGaO_2$ substrate, a $MgAl_2O_4$ substrate, an InP substrate, a Si substrate, and these substrates each having an underlying layer and a buffer layer formed on a surface (main surface) thereof.

When the first conductivity type is n-type, the second conductivity type is p-type, while when the first conductivity type is p-type, the second conductivity type is n-type.

As the first electrode, an electrode composed of titanium (Ti) or a titanium alloy such as TiW or TiMo (for example, a TiW layer or a Ti/Ni/Au layer) or an electrode composed of aluminum (Al) or an aluminum alloy can be used. Herein, a layer described in front of "/" is positioned closer to the substrate (i.e., at a lower position). This applies to the description below. In addition, the second electrode may contain, for example, silver (including a silver alloy containing In, Cu, Pd, Ni, Co, Rh, or Pt). As the first electrode extension and the first and second pad portions, a multilayer metal layer having a laminated structure, [an adhesive layer (a Ta layer or Cr layer)]/[a barrier metal layer (a Pt layer, a Ni layer, a TiW layer, or a Mo layer)]/[a metal layer with excellent compatibility in mounting (e.g., a Au layer)], such as a Ti/Pt/Au structure, or the like, can be used. As the method for forming the first electrode, the method for forming the second electrode, and the method for forming the first electrode extension and the first and second pad portions, the PVD method such as the vacuum deposition or sputtering method, any one of various CVD methods, or a plating method can be used. Further, a protective layer including, for example, a TiW/Pd/TiW/Ni layer, may be provided between the second electrode and the insulating layer. By providing the protective layer, it is possible to securely prevent that solder or a gold ball is melted and diffuses in the insulating layer (passes through the insulating layer) to reach the second electrode during the assembly of the light-emitting device. As the method for forming the first electrode and the second electrode, and the method for forming the first electrode extension, the first and second pad portions, and the protective layer, the PVD method such as the vacuum deposition or sputtering method, any one of various CVD methods, or a plating method can be used. Although the second electrode is formed on the second compound semiconductor layer (e.g., over the substantially entire top surface of the second compound semiconductor layer), the second electrode may be formed over the entire top surface of the second compound semiconductor layer or on the top surface of the second compound semiconductor layer to have an area smaller than the top surface of the second compound semiconductor layer. The first and second pad portions may be made of the same material and formed at the same time.

As the method for forming the first and second openings, a lithographic process, a wet etching process, or a combination of wet etching and dry etching processes can be used.

As described above, maximization of the luminescent area by minimizing the first electrode and stabilization of mounting properties by securing the pad area are contrary conditions for a general light-emitting element. Therefore, in the light-emitting device of the present invention, the insulating layer is formed on the second electrode, and the first pad portion with a large area is provided on the insulating layer so as to be electrically connected to the first electrode while minimizing the first electrode, thereby forming the multilayer electrodes and satisfying the contrary conditions. Namely, in the light-emitting device of the present invention, the first electrode extension is extended from the first electrode formed on the first compound semiconductor layer to the insulating layer through the first opening, and the first pad portion includes a portion of the first electrode extension which is positioned on the insulating layer. Therefore, it is possible to design the first electrode so as to minimize (narrow) the area thereof without deteriorating the electric characteristics. On the other hand, it is possible to provide the first and second pad portions of a size which does not apply a large load (decrease in mechanical strength and mounting property) in a wire bonding step and a die bonding step as a step of assembling the light-emitting device (assembling on a circuit board or a package base), thereby satisfying the requirement for narrowing the area of the first electrode at the same time.

Further, when the material constituting the insulating layer is appropriately selected, a capacitor portion or varistor portion can be formed using the first electrode extension, the insulating layer, and the second electrode. Thus, it is possible to impart the light-emitting device with high electrostatic breakdown strength and achieve the manufacture of the light-emitting device in high yield without increasing the manufacturing cost of the light-emitting device. In particular, the manufacturing cost of an electronic apparatus can be decreased in a field in which a large number of light-emitting devices is used, such as in the application to a lighting system, a backlight of a liquid crystal display device, or a light-emitting diode display device. Also, in particular, in a light-emitting device including a nitride compound semiconductor layer which has difficulty in increasing electrostatic breakdown strength, breakage due to external static electricity can be prevented, resulting in contribution to significant improvement in the reliability in a mounting step and in actual use.

When the varistor portion is formed using the first electrode extension, the insulating layer, and the second electrode, in light-emitting devices connected in series, even if a current does not flow in the luminescent layer of a light-emitting device due to an accidental failure of the light-emitting device, a current flows through the varistor portion of the failed light-emitting device when an appropriate value is selected as the breakdown voltage of the varistor portion. Therefore, it is possible to prevent the occurrence of the worst in which all the light-emitting devices connected in series are made inoperative and to significantly improve the reliability of a product in which a light-emitting device is incorporated. Further, both the capacitor portion and the varistor portion have the property that V-I characteristics are symmetric with respect to the origin, countermeasure can be made at the same time in both the forward and reverse directions as compared with electrostatic measure based on a Zener diode, thereby facilitating the handling of the device.

BRIEF DESCRIPTION OF THE DRAWINGS

FIG. 2 is a schematic plan view of the light-emitting device (light-emitting diode) of the first embodiment;

FIG. 15A is a schematic view of the arrangement of components of a conventional light-emitting device and FIG. 15B is a schematic sectional view of the conventional light-emitting device taken along arrow XVB-XVB in FIG. 15A.

DESCRIPTION OF THE PREFERRED EMBODIMENTS

The present invention will be described on the basis of embodiments with reference to the drawings.

First Embodiment

Figure 1A:
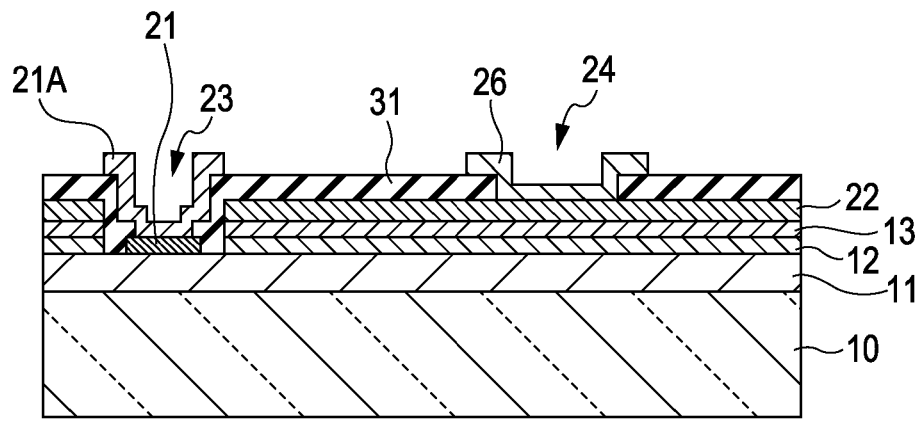
FIGS. 1A and 1B are schematic end views of a light-emitting device according to a first embodiment of the present invention, taken along arrows A-A and B-B, respectively, in FIG. 2.
Figure 1B:
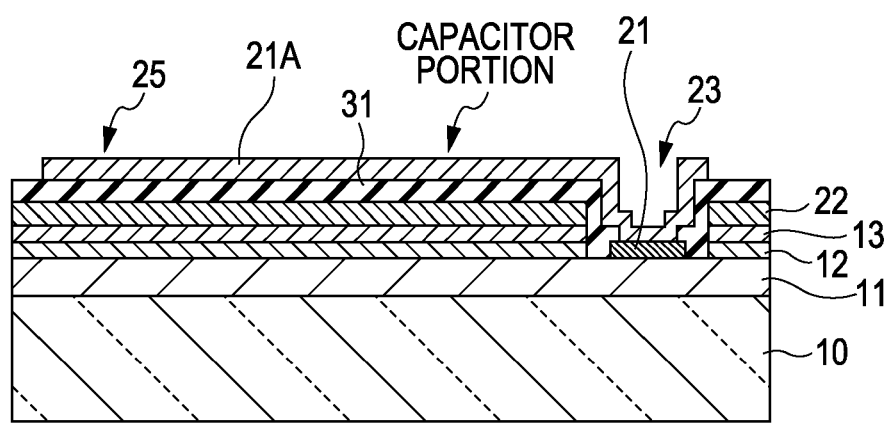

A first embodiment of the present invention relates to a light-emitting device. The light-emitting device according to the first embodiment includes a light-emitting diode including a GaN compound semiconductor layer. FIG. 2 is a schematic plan view, and FIGS. 1A and 1B are schematic end views taken along arrows IA-IA and IB-IB, respectively, in FIG. 2. As shown in the drawings, the light-emitting device includes the following:

(A) a first compound semiconductor layer 11 of a first conductivity type (in this embodiment, n-type), an active layer 12 having a quantum well structure, and a second compound semiconductor layer 13 of a second conductivity type (in this embodiment, p-type) different from the first conductivity type;

(B) a second electrode 22 formed on the second compound semiconductor layer 13 (specifically, over the substantially entire top surface of the second compound semiconductor layer 13);

(C) an insulating layer 31 covering the second electrode 22;

(D) a first opening 23 provided to pass through the insulating layer 31, the second electrode 22, the second compound semiconductor layer 13, and the active layer 12 and expose the first compound semiconductor layer 11 at the bottom thereof;

(E) a second opening 24 provided to pass through the insulating layer 13 and expose the second electrode layer 22 at the bottom thereof;

(F) a first electrode 21 formed on the exposed portion of the first compound semiconductor layer 11 at the bottom of the first opening 23;

(G) a first electrode extension 21A extending from the first electrode to the top of the insulating layer 31 through the first opening 23, and a first pad portion 25 including a portion of the first electrode extension 21A positioned on the insulating layer 31; and (H) a second pad portion 26 connected to the exposed portion of the second electrode 22 at the bottom of the second opening 24.

In this embodiment, the first compound semiconductor layer 11, the active layer 12, and the second compound semiconductor layer 13 are formed on a substrate 10 in that order.

The substrate 10 includes a substrate 10A composed of sapphire and an underlying layer 10B formed on the substrate 10A and composed of GaN. A luminescent layer has a laminated structure in which the first compound semiconductor layer 11 composed of Si-doped GaN (GaN:Si), the active layer 12 including an InGaN layer (well layer) and a GaN layer (barrier layer) and having a multiquantum well structure, and the second compound semiconductor layer 13 composed of Mg-doped GaN (GaN:Mg) are laminated. Further, the first electrode 21 includes a Ti/Au/Ni layer, and the second electrode 22 includes a Ag alloy/Ni layer and is formed on the top surface of the second compound semiconductor layer 13 in the same size as the top surface of the second compound semiconductor layer 13. The insulating layer 31 is composed of barium titanate ($BaTiO_3$), and the first electrode extension 21A including the first pad portion 25 and the second pad portion 26 each include a Ti/Ni/Au layer. Namely, in the first embodiment, the first electrode extension 21A and the first electrode 21 are separately formed using separate members. On the other hand, the first pad portion 25 and the first electrode extension 21A are formed at the same time using an integrated member. The second pad portion 26 extends from the second electrode 22 to the insulating layer 31 through the second opening 24. Further, a plating layer (not shown) including a Au layer is formed on the first pad portion 25 and the second pad portion 26 in order to improve the reliability in a wire bonding step and a die bonding step, and a protective layer (not shown) including a TiW/Pd/TiW/Ni layer is provided between the second electrode 22 and the insulating layer 31. The light-emitting diode according to the first embodiment is a substrate-side emission type in which when a current is passed from the second electrode 22 to the first compound semiconductor layer 11 and the first electrode 21 through the second compound semiconductor layer 13 and the active layer 12, the quantum well structure in the active layer 12 is excited by injection of the current to create a light emission state over the entire surface, thereby emitting light to the outside through the substrate 10.

Figure 12A:
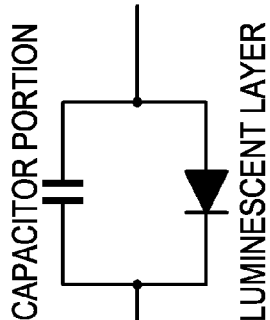
FIG. 12A to 12G are drawings of equivalent circuits of a light-emitting device according to an embodiment of the present invention.

In the first embodiment, the first electrodes 21 are provided at three positions. The first electrode extensions 21A of a plurality (three) of the first electrodes 21 are combined to form the first pad portion 25. On the other hand, the second pad portions 26 are provided at two positions. The two second pad portions 26 are arranged symmetrically with respect to a virtual plane passing through the center of the first pad portion 25 and including a normal line (center axis line 27) passing through the center of the light-emitting device. With this constitution, the position of the light-emitting diode can be maintained by three-point support with high stability during assembly of the light-emitting diode. The first electrodes 21 are arranged symmetrically with respect to a virtual plane including a normal line (center axis line 27) passing through the center of the light-emitting diode or rotationally symmetric with respect to the center axis line 27. The size of the first electrodes 21 has a diameter of 40 μm. The area per first electrode is $1.3 \times 10^{+5}$ $cm^2$. The distances from the centers of the respective first electrodes 21 to the centers of the adjacent first electrodes 21 are 200 μm, 200 μm, and 185 μm. The portion of the first electrode extension 21A which is positioned on the insulating layer 31, the insulating layer 31, and the second electrode 22 form a capacitor portion (refer to an equivalent circuit view of FIG. 12A). The capacitor portion or a varistor portion which will be described below is shadowed in FIG. 2. The area of the shadowed portion of the first electrode extension 21A shown in FIG. 2 is $2\times10^{-4}$ cm². The area of the second electrode 22 is 360 μm × 360 μm =0.108 cm2, the average thickness and dielectric constant .di-elect cons. of the insulating layer are 0.3 μm and =200 to 500, and the capacity of the capacitor portion is 120 pF to 300 pF. The junction capacitance of the luminescent layer in an unbias state is about 140 pF. In a light-emitting diode of a 300 μm to 400μm -square size, the junction capacitance in an unbias state is generally 100 pF to 300 pF.

The method of manufacturing the light-emitting device of the first embodiment will be described with reference to FIGS. 3A, 4A, 5A, 6A and 7A which are schematic partial plan views the substrate and FIGS. 4B, 4C, 5B, 5C, 6B, 6C, 7B, and 7C which are schematic partial end views of the substrate. FIGS. 4B, 5B, 6B, and 7B are schematic partial end views taken along the same arrow as IA-IA in FIG. 2, and FIGS. 4C, 5C, 6C, and 7C are schematic partial end views taken along the same arrow as IB-IB in FIG. 2.

Step-100

First, the substrate 10A composed of sapphire is charged in a MOCVD apparatus and cleaned in a carrier gas composed of hydrogen at a substrate temperature of 1050° C. for 10 minutes. Then, on the basis of the MOCVD method, the substrate temperature is decreased to 500° C., and trimethylgallium (TMG) gas used as a gallium raw material is supplied while ammonia gas is supplied as a nitrogen raw material to form the underlying layer 10B composed of GaN by crystal growth on the surface of the substrate 10A. Then, the supply of the TMG gas is stopped.

Step-110

Next, the first compound semiconductor layer 11 of the first conductivity type, the active layer 12, and the second compound semiconductor layer 13 of the second conductivity type different from the first conductivity type are formed in order on the substrate 10.

Specifically, on the basis of the MOCVD method, the substrate temperature is increased to 1020° C., and then the supply of monosilane ($SiH_4$) gas as a silicon raw material is started at normal pressure to form, by crystal growth, the first compound semiconductor layer 11 composed of Si-doped GaN (GaN:Si) and having n-type conductivity and a thickness of 3 μm on the underlying layer 10B. The doping concentration is, for example, about $5\times10^{18}$/cm³.

Then, the supply of TMG gas and $SiH_4$ gas is temporarily stopped, and the substrate temperature is decreased to 750° C. Then, the valve is switched to supply triethylgallium (TEG) gas and trimethylindium (TMI) gas to form the active layer 12 composed of InGaN and GaN and having a multiquantum well structure by crystal growth.

For example, for a light-emitting diode with an emission wavelength of 400 nm, a multiquantum well structure (for example, two well layers) composed of InGaN at an In component ratio of about 9% and GaN (thicknesses of 2.5 nm and 7.5 nm) may be formed. For a blue light-emitting diode with an emission wavelength of 460 nm±10 nm, a multiquantum well structure (for example, 15 well layers) composed of InGaN at an In component ratio of about 15% and GaN (thicknesses of 2.5 nm and 7.5 nm) may be formed. Further, for a green light-emitting diode with an emission wavelength of 520 nm±10 nm, a multiquantum well structure (for example, 9 well layers) composed of InGaN at an In component ratio of about 23% and GaN (thicknesses of 2.5 nm and 15 nm) may be formed.

After the formation of the active layer 12, the supply of the TEG gas and the TMI gas is stopped, and the carrier gas is switched from nitrogen to hydrogen. Then, the substrate temperature is increased to 850° C., and the supply of TMG gas and biscyclopentadienyl magnesium ($Cp_2Mg$) gas is started to form, by crystal growth, the second compound semiconductor layer 13 composed of Mg-doped GaN (GaN:Mg) having a thickness of 100 nm on the active layer 12. The doping concentration is about $5\times10^{19}$/cm³. Then, the supply of the TMG gas the $Cp_2Mg$ gas is stopped, and the substrate temperature is decreased to room temperature, completing the crystal growth.

Step-120

After the completion the crystal growth, the substrate is annealed in a nitrogen atmosphere at about 800° C. for 10 minutes to activate p-type impurities (p-type dopant).

Step-130

Figure 3A:
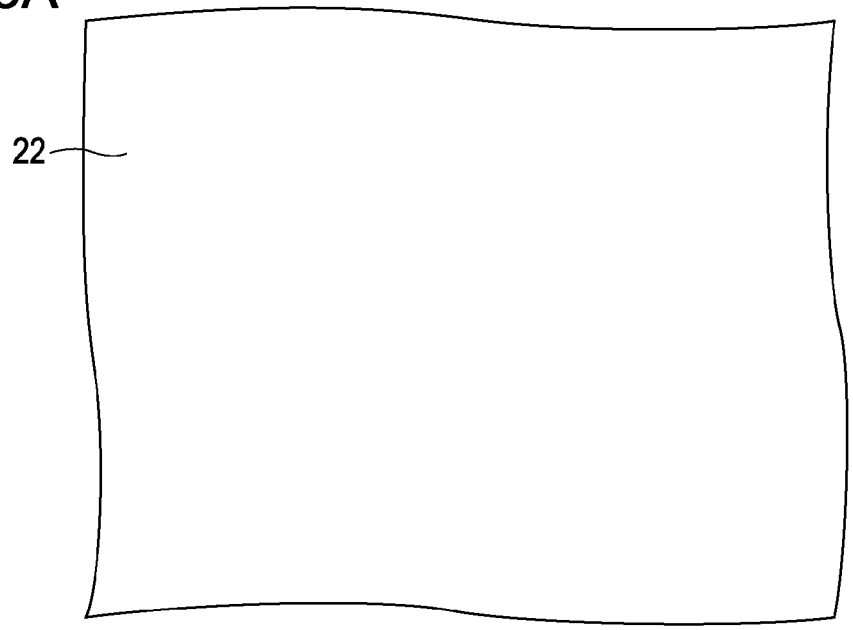
FIG. 3A is a schematic partial plan view and FIGS. 3B and 3C are schematic partial end views, for illustrating a method for manufacturing the light-emitting device (light-emitting diode) of the first embodiment.
Figure 3B:
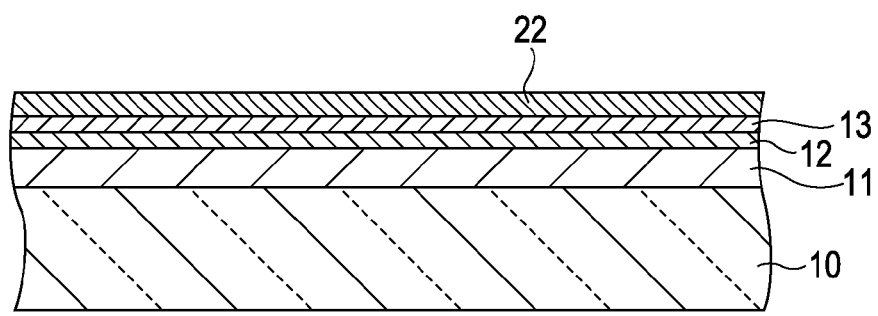
Figure 3C:
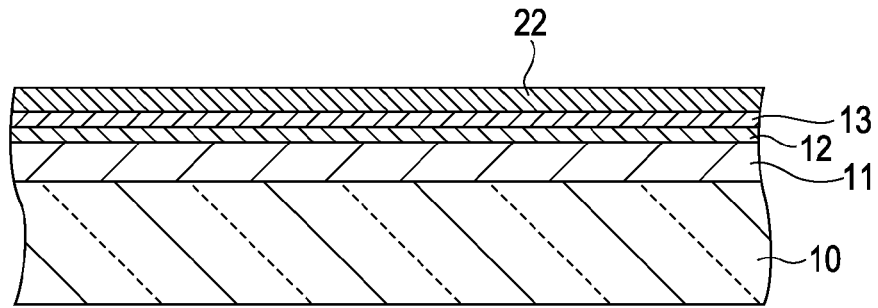
Figure 4A:
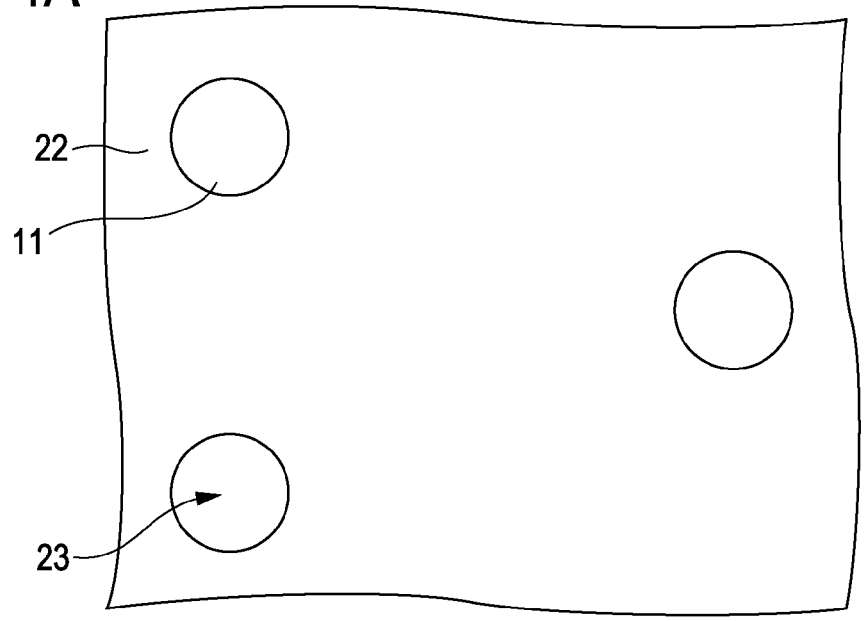
FIG. 4A is a schematic partial plan view and FIGS. 4B and 4C are schematic partial end views, for illustrating the method for manufacturing the light-emitting device (light-emitting diode) of the first embodiment in succession to FIGS. 3A, 3B, and 3C.
Figure 4B:
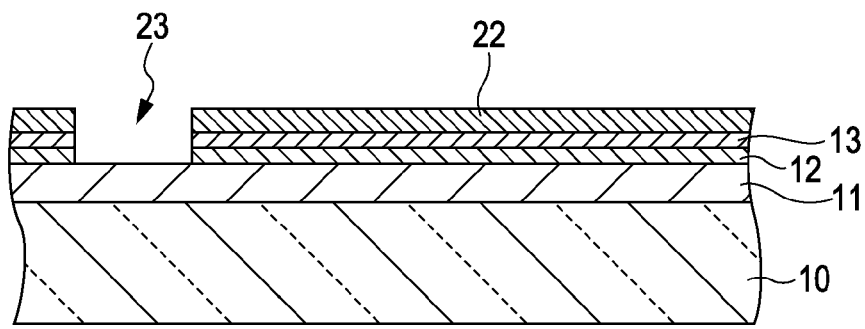
Figure 4C:
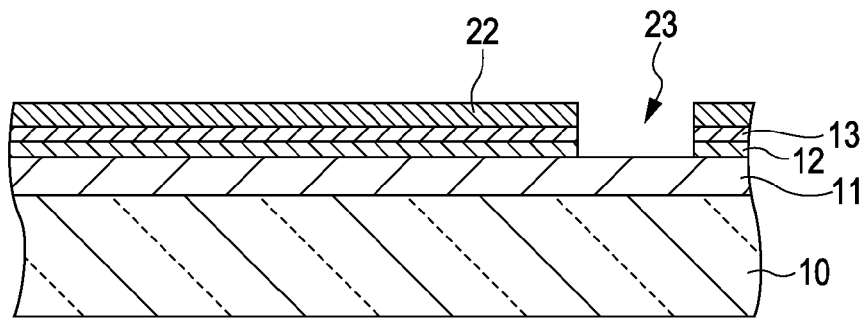
Figure 5A:
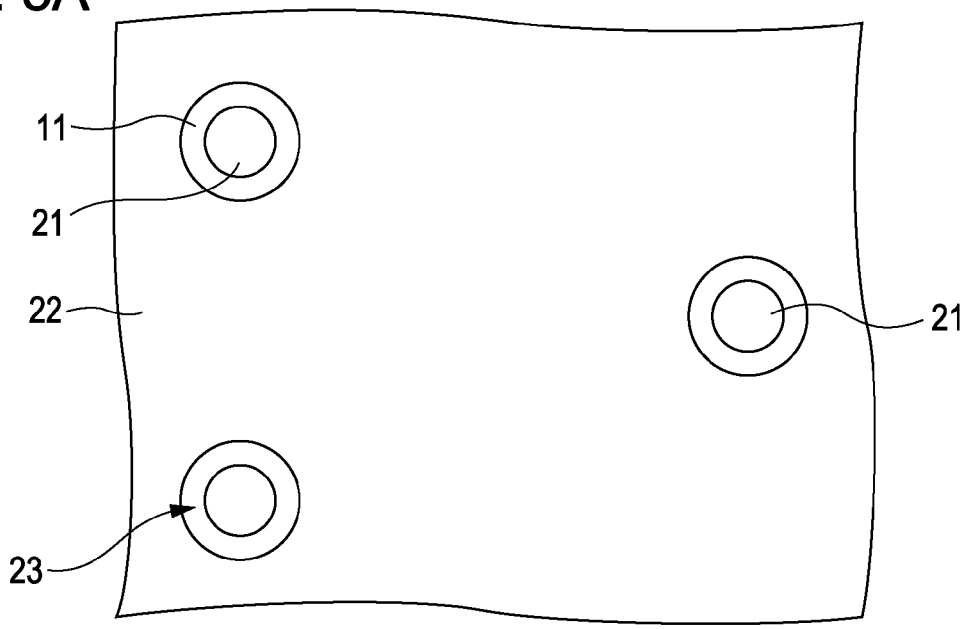
FIG. 5A is a schematic partial plan view and FIGS. 5B and 5C are schematic partial end views, for illustrating the method for manufacturing the light-emitting device (light-emitting diode) of the first embodiment in succession to FIGS. 4A, 4B, and 4C.
Figure 5B:
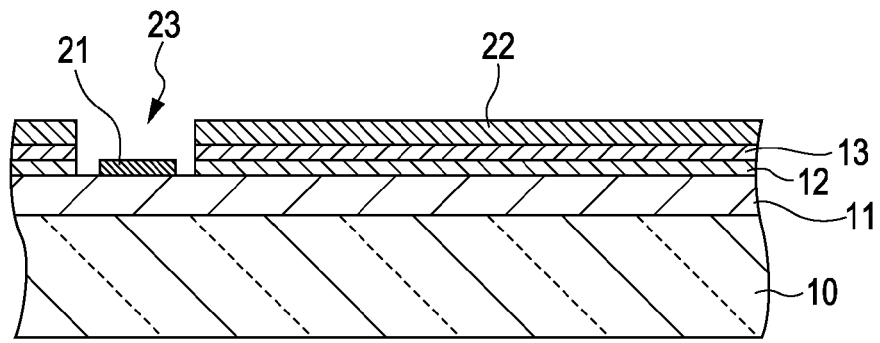
Figure 5C:
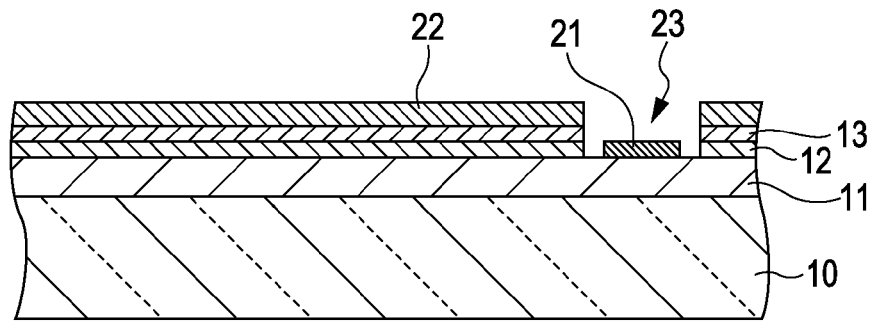

Then, the second electrode 22 including a Ag alloy layer and a Ni layer is formed on the second compound semiconductor layer 13 on the basis of a so-called lift-off method. Specifically, a resist layer is formed over the entire surface, and an opening is formed by, lithography, in a portion of the resist layer in which the second electrode 22 is to be formed. Then, a Ag alloy layer and a Ni layer are formed over the entire surface on the basis of sputtering or vacuum deposition, and then the resist layer and the Ag alloy layer and the Ni layer formed thereon are removed. As a result, the state shown in FIGS. 3A, 3B, and 3C can be achieved. After the Ag alloy layer and the Ni layer are formed, a protective layer (not shown) including a TiW/Pd/TiW/Ni layer is preferably provided by sputtering.

Step-140

The first openings 23 are formed at three positions on the basis of lithography and a dry etching method so as to pass through the second electrode 22, the second compound semiconductor layer 13, and the active layer 12. As a result, the first compound semiconductor layer 11 is exposed as the bottoms of the first openings 23, thereby achieving the state shown in FIGS. 4A, 4B, and 4C. The first openings 23 may be formed in the second electrode 22 at the same time as the formation of the second electrode 22 in Step-130.

Step-150

Then, the first electrode 21 including a Ti/Au/Ni layer is formed on the exposed portions of the first compound semiconductor layer 11 at the bottoms of the first openings 23 on the basis of the lift-off method. Specifically, a resist layer is formed over the entire surface, and openings are formed by, lithography, in portions of the resist layer in each of which the first electrode 21 is to be formed. Then, a Ti/Au/Ni layer is formed over the entire surface on the basis of sputtering or vacuum deposition, and then the resist layer and the Ti/Au/Ni layer formed thereon are removed. As a result, the state shown in FIGS. 5A, 5B, and 5C can be achieved.

Step-160

Figure 6A:
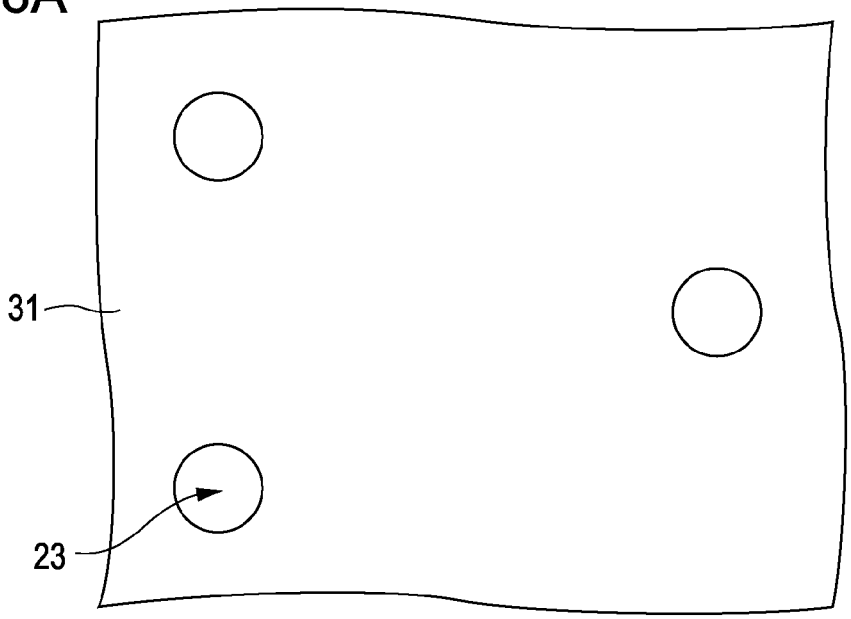
FIG. 6A is a schematic partial plan view and FIGS. 6B and 6C are schematic partial end views, for illustrating the method for manufacturing the light-emitting device (light-emitting diode) of the first embodiment in succession to FIGS. 5A, 5B, and 5C.
Figure 6B:
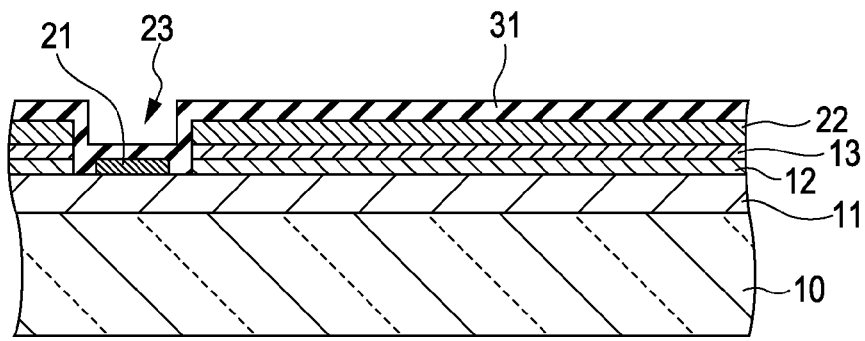
Figure 6C:
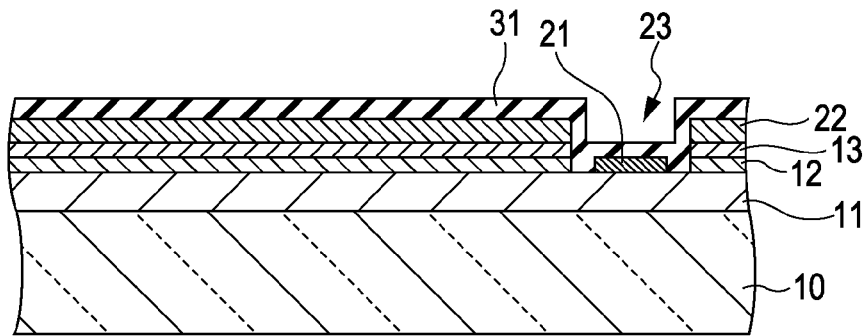
Figure 7A:
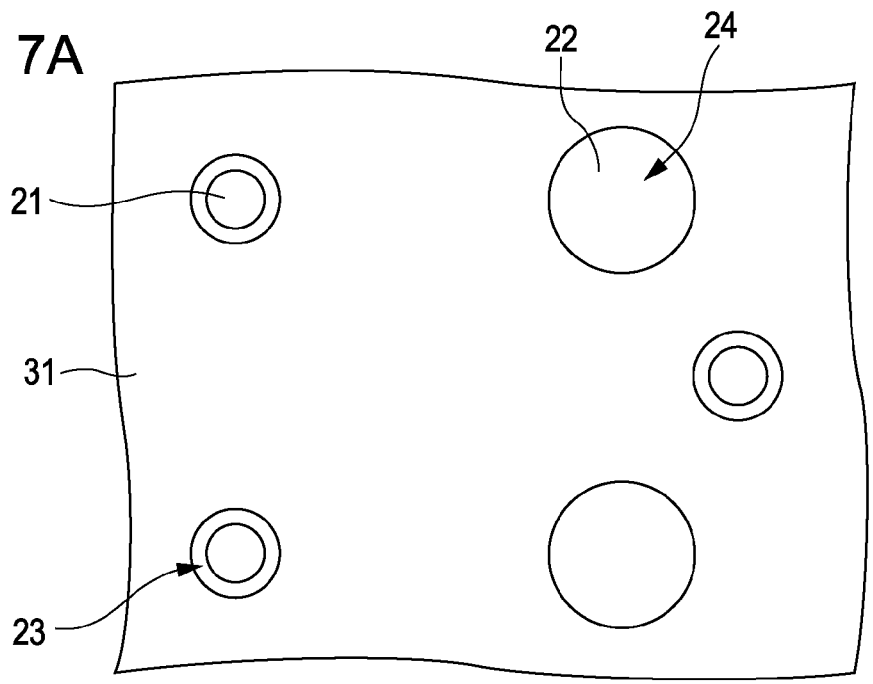
FIG. 7A is a schematic partial plan view and FIGS. 7B and 7C are schematic partial end views, for illustrating the method for manufacturing the light-emitting device (light-emitting diode) of the first embodiment in succession to FIGS. 6A, 6B, and 6C.
Figure 7B:
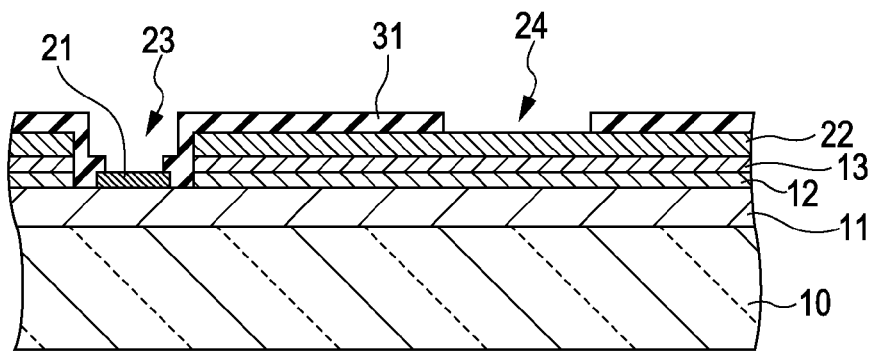
Figure 7C:
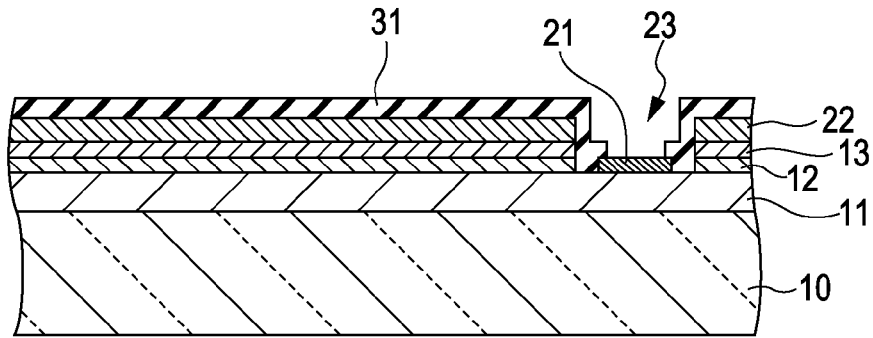

Next, the insulating layer 31 composed of barium titanate ($BaTiO_3$) and having a thickness of 0.3 μm is formed over the entire surface on the basis of the sputtering method (refer to FIGS. 6A, 6B, and 6C). Then, a portion of each of the first openings 23 is formed in the insulating layer 31 on the first electrode 21 disposed at the bottom of each first opening 23 on the basis of lithography and the dry etching method, and the insulating layer 31 is removed from portions in each of which the second pad portion 26 is to be formed, thereby forming the second openings 24 at two positions in the insulating layer 31. As a result, the second compound semiconductor layer 13 (more specifically, the protective layer not shown) is exposed at the bottoms of the second openings 24.

The insulating layer 31 extends on the sidewalls of the first openings 23 and covers the sidewalls of the first openings 23. Consequently, the state shown in FIGS. 7A, 7B, and 7C can be achieved.

Step-170

Then, the first electrode extension 21A including the first pad portion 25 and the second pad portions 26 are formed on the basis of the lift-off method. Specifically, a resist layer is formed over the entire surface, and an opening is formed by, lithography, in a portion of the resist layer in which each of the first electrode extension 21A including the first pad portion 25 and the second pad portions 26 is to be formed. Then, a Ti/Ni/Au layer is formed over the entire surface on the basis of sputtering or vacuum deposition, and then the resist layer and the Ti/Ni/Au layer formed thereon are removed. The first electrode extension 21A extends from the first electrodes 21 to the top of the insulating layer 31 through the extensions of the insulating layer 31 on the sidewalls of the respective first openings 23.

Step-180

Next, in order to further improve reliability in a wire bonding step and a die bonding step, a plating layer (not shown) including an Au layer is formed on the first pad portion 25 and the second pad portions 26.

Step-190

Finally, dicing into chips and further resin molding and packaging are performed to complete, for example, various light-emitting diodes of a shell type and a surface-mount type. Through the above-described steps, the light-emitting diode shown in FIGS. 1A and 1B, and 2 can be obtained. However, FIGS. 1A and 1B, and 2 each schematically show some of the components in a state after dicing.

In the light-emitting diode of the first embodiment, the first electrode 21 is minimized and disposed at a position at minimum (in the first embodiment, three positions), and the size and arrangement of the first electrodes 21 are determined on the basis of the balance of the spreading of current flows from the second electrode 22 to the first electrodes 21 and the balance of the contact resistances between the first electrodes 21 and the first compound semiconductor layer 11. Specifically, when the first electrodes 21 are arranged in well balance so that the distance from the center of one of the first electrodes 21 to the center of the adjacent first electrode 21 is $3 \times 10^{-4}$ m (300 μm) or less, it is possible to realize a light-emitting diode which can be driven at a drive voltage equivalent to or lower than that of the general light-emitting diode shown in FIGS. 15A and 15B. In the light-emitting diode of the first embodiment, the area of the second electrode 22 can be increased by 10% or more as compared with the general light-emitting diode shown in FIGS. 15A and 15B. Therefore, even with the same drive current, the current density per electrode unit area can be decreased, and thus the light-emitting diode can be driven with higher efficiency.

When the sizes of the first electrodes 21 provided at three positions have diameters of 30 μm, 40 μm, and 50 μm, the drive voltage is not so changed. In addition, when the first diameter 21 of 50 μm in diameter is provided at the center of the light-emitting diode, the drive voltage is not so changed.

Further, when the first electrodes are provided at three positions, the spread of the current is well balanced, resulting in a decrease in variation in excitation of the luminescent layer and improvement in the luminescent state over the entire portion of the luminescent layer.

Therefore, the effect of improving luminance by 20% or more is obtained, and the luminous efficiency can be significantly improved with the same chip area. When the first pad portion is provided at one position, and the second pad portions 26 are provided at two positions, in mounting the light-emitting diode, the mounting surface can be made single, thereby securely avoiding amounting defects such as defective connection to a mounting substrate.

Figure 13:
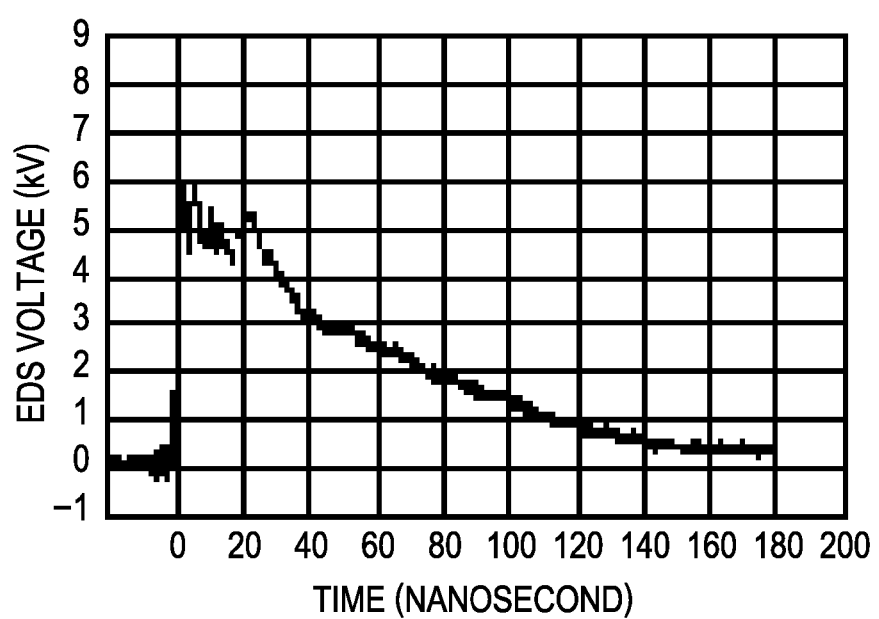
FIG. 13 is a graph showing an example of an ESD voltage waveform.

When a pulse voltage (referred to as ESD (Electro-Static Discharge) voltage) is applied from the outside due to static electricity to the light-emitting diode having the above-described structure, part of the ESD current flows into the luminescent layer, and the remainder flows into a capacitor portion. The proportion is determined by the impedance ratio. Namely, of components at the same wavelength, the impedance of a component with larger capacitance is decreased, and a larger quantity of current flows into this component. When a capacity component of several hundreds pF to more than several nF is present as a load on the ESD voltage pulse, in an ESD voltage waveform as shown in FIG. 13, the waveform of an early component (a high-frequency component within several nanoseconds from rising) is significantly distorted by an action due to charge-discharge of a capacitor portion, and the waveform is instantaneously deformed to a pulse with a small load in which a voltage pulse disappears. Therefore, the effect of decreasing the load of the ESD voltage of the capacitor portion provided in parallel with the luminescent layer on the luminescent layer significantly improves the ESD resistance as compared with a single light-emitting device.

In designing the capacitor portion, the main purpose is to prevent ESD breakdown of the light-emitting device, and thus the two conditions below should be satisfied.

(1) The capacitor portion has capacitance sufficiently larger than the junction capacitance of the luminescent layer and low impedance to the ESD voltage pulse.

(2) The capacitor portion has electro-static breakdown strength equivalent to or higher than the electro-static breakdown strength of the luminescent layer.

With respect to the electro-static breakdown strength (2), the insulating layer deposited by a usual method (a sputtering method or CVD method) for depositing an insulating layer has sufficient electro-static breakdown strength to a pulse voltage such as the ESD voltage, and a strength higher than the electro-static breakdown strength of the luminescent layer can be secured, thereby causing no problem of the dielectric breakdown strength of the insulating layer.

On the other hand, with respect to the condition (1), it is necessary to decrease the thickness of the insulating layer, increase the area of the overlap between the second electrode and the first electrode extension disposed on the insulating layer, and form the insulating layer using a material having a higher dielectric constant ∈ depending on the size of the light-emitting diode and the structure of the luminescent layer. However, from the viewpoint of the limitation of the size of the light-emitting diode, the actual deposition method, and the minimum dielectric strength to be secured, it is difficult to significantly improve the thickness of the insulating layer and the area of the overlap between the second electrode and the first electrode extension disposed on the insulating layer. In the first embodiment, therefore, the condition (1) is satisfied by using a material having a dielectric constant ∈ of $1 \times 10^2$ or more as the material for forming the insulating layer.

Second Embodiment

Figure 8A:
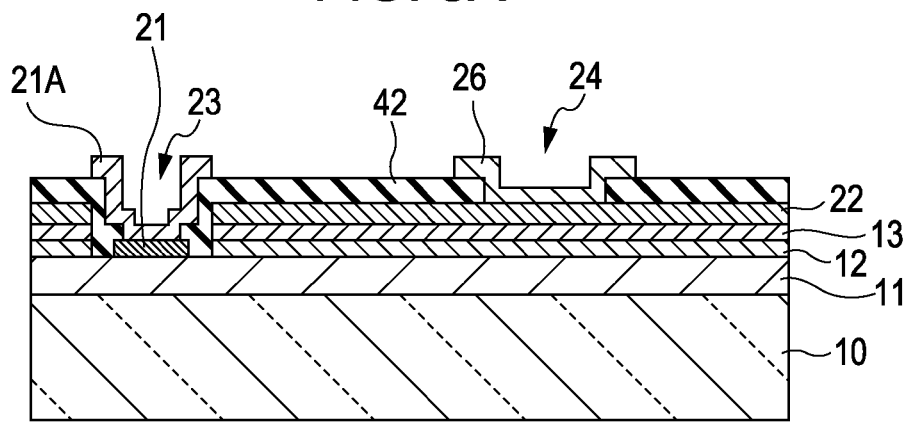
FIGS. 8A and 8B are schematic end views of a light-emitting device according to a second embodiment of the present invention, taken along the same arrows as IA-IA and IB-IB, respectively, in FIG. 2.
Figure 8B:
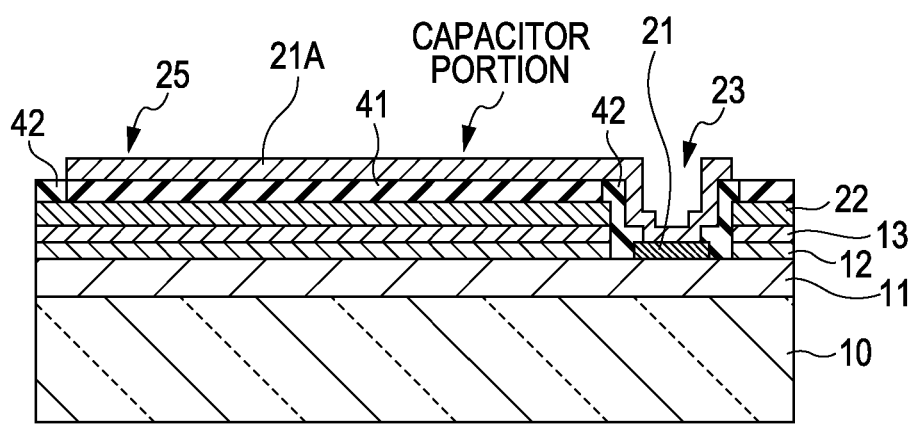

The second embodiment is a modification of the first embodiment. In the first embodiment, the insulating layer 31 includes a layer made of the same material. However, in the second embodiment, as shown in FIGS. 8A and 8B which are schematic end views taken along the same arrows as IA-IA and IB-IB in FIG. 2, respectively, the insulating layer includes a first portion 41 provided between a portion of the first electrode extension 21A disposed on the insulating layer and the second electrode 22, and a second portion 42 provided in the other region.

The first portion 41 of the insulating layer is composed of barium titanate ($BaTiO_3$) like the insulating layer 31 of the first embodiment, while the second portion 42 of the insulating layer is composed of a SOG layer. The first portion 41 of the insulating layer is provided in a portion shadowed in FIG. 2.

In a usual technique, pinholes or cracks easily occur in an insulating film 114 formed on the basis of the CVD or PVD method, and when a steep step portion is present due to an electrode structure or device structure, it may be possible to difficult to securely cover the step portion with the insulating film 114. Further, pinholes or cracks may occur in the insulating film 114 due to the presence of contamination or foreign matter. When pinholes or cracks only slightly occur in the insulating film 114 or the step coatability is low, moisture enters from the external atmosphere and reaches the second electrode composed of silver (Ag) to cause ion migration or whiskers in the second electrode, thereby deteriorating the second electrode and consequently deteriorating the characteristics of the light-emitting diode.

As a method for suppressing the occurrence of pinholes or cracks, the substrate heating temperature during deposition of the insulating film 114 is increased, or the surface of the second electrode is cleaned by reverse sputtering to improve the base. However, another problem may occur due to the influence of a thermal history or plasma damage. Further, it may be difficult to securely cover the steep step with the insulating film 114, and the step portion may become a discontinuous point of growth of the insulating film 114.

Therefore, in order to obtain a light-emitting device having a structure in which pinholes or cracks little occur and an electrode is covered with an insulating layer having excellent step coatability, in the second embodiment, the second portion 42 of the insulating layer includes a SOG layer. A SOG material layer which is a precursor for forming the SOG layer is liquid, and thus the second electrode 22 can be covered by a coating method. Thus, the second electrode 22 can be securely covered with a continuous film with no grain boundary, and pinholes or cracks do not occur. As a result, moisture from the outer atmosphere can be securely prevented from reaching the second electrode 22 composed of, for example, silver (Ag). It is thus possible to securely prevent the problem that ion migration or whiskers occur to deteriorate the second electrode 22 and consequently deteriorate the characteristics of the light-emitting device. Therefore, the reliability of the light-emitting device can be improved, and stable characteristics can be maintained even in a severe environment. Further, an increase in yield of the manufacture of the light-emitting device can be achieved.

The SOG material layer represents a layer formed by applying, by any of various application methods, a solution prepared by dissolving a silicate compound (mainly silanol, polysilazane (compound composed of Si, 0, (N, H), an alkyl group, and an alkoxy group) in an organic solvent (e.g., an alcohol or butyl acetate). After the organic solvent is removed from the SOG material layer, the SOG material layer is fired to prepare the SOG layer composed of silicate glass ($SiO_2$) as a main component. Although the SOG layer generally has high internal stress, a problem due to the internal stress can be prevented by forming the thin SOG layer of $1 \times 10^{-7}$ m (0.1 μm) to $5 \times 10^{-7}$ m (0.5 μm). Examples of the application method include a spin coating method; various printing methods such as a screen printing method, an ink jet printing method, an offset printing method, and a gravure printing method; various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, a calendar coater method, and a dipping method; a stamp method; and a spray method.

The SOG layer can be obtained by firing the SOG material layer, and the firing conditions for the SOG material layer are as follows:

Firing atmosphere: an inert gas atmosphere or an inert gas atmosphere containing 0.1% by volume to 20% by volume of oxygen gas, preferably 2% by volume to 5% by volume of oxygen gas Firing temperature: 250° C. to 700° C., preferably 400° C. to 600° C.

Firing time: 5 minutes to 60 minutes, preferably 20 minutes to 40 minutes

After the SOG layer is formed, the surface of the SOG layer is preferably further exposed to a plasma atmosphere. By exposing the surface of the SOG layer to a plasma atmosphere, organic substances (e.g., hydrocarbons) contained in the surface of the SOG layer are removed to form the SOG layer of high quality. As the conditions for the plasma atmosphere, $O_2$ gas, Ar gas, or $N_2$ gas, or a mixture thereof is used as the plasma atmosphere, the pressure is 0.1 Pa to 100 pa, and the applied power and treatment time may be determined in view of the plasma apparatus used and plasma damage and effect. For example, the applied power is 350 W, and the treatment time is about 10 minutes.

Except the above-described points, the light-emitting diode of the second embodiment may have the same constitution and structure as the light-emitting diode of the first embodiment. Therefore, detailed description of the light-emitting diode of the second embodiment is omitted. The method for manufacturing the light-emitting diode of the second embodiment will be outlined.

Step-200

First, the same steps as step-100 to step-150 of the first embodiment are executed.

Step-210

Next, the first portion 41 of the insulating layer is formed on the basis of the lift-off method. Specifically, a resist layer is formed over the entire surface, and an opening is formed in a portion of the resist layer in which the first portion 41 of the insulating layer is to be formed on the second electrode 22. Then, a barium titanate layer is formed over the entire surface by the same sputtering method as in step-160 of the first embodiment. Then the resist layer is removed to form the first portion 41 of the insulating layer.

Step-220

Then, the second portion 42 of the insulating layer is formed. Specifically, first, the SOG material layer corresponding to a precursor of the SOG layer and composed of a solution prepared by dissolving a silicate compound in an organic solvent is formed over the entire surface by, for example, a spin coating method. Next, the organic solvent is removed from the SOG material layer, and the SOG material layer is fired to form the SOG layer containing silicate glass ($SiO_2$) as a main component. The SOG material layer can be fired under conditions, for example, in an inert gas atmosphere such as a nitrogen gas atmosphere at 400° C. for 20 minutes. Next, the SOG layer is planarized to remove the SOG layer formed on the first portion 41 of the insulating layer. As a result, the insulating layer including the first portion 41 and the second portion 42 can be formed.

Step-230

Next, a portion of the first opening 23 is formed, on the basis of lithography and the dry etching method, in the second portion 42 of the insulating layer which is positioned above the first electrode 21 at the bottom of the first opening 23. At the same time, the second portion of the insulating layer is removed from portions in each of which the second pad portion 26 is to be formed to form the second openings 24 at two positions in the insulating layer 31. As a result, the second compound semiconductor layer 13 (more specifically, the protective layer not shown) is exposed at the bottoms of the second openings 24.

Step-240

Then, the first electrode extension 21A including the first pad portion 25 and the second pad portions 26 are formed by the same method as in step-170 of the first embodiment on the basis of the lift-off method. Further, the same steps as step-180 to step-190 of the first embodiment are executed to complete the light-emitting diode.

The step of exposing the surface of the SOG layer to a plasma atmosphere may be performed between step-220 and step-230. By exposing the surface of the SOG layer to a plasma atmosphere, organic substances (e.g., hydrocarbons) contained in the surface of the SOG layer are removed to form the SOG layer of high quality. Examples of the conditions for the plasma atmosphere include the conditions shown in Table 1 below.

TABLE 1

| Plasma atmosphere: $O_2$ gas, Ar gas, or $N_2$ gas, or a mixture thereof | |
|---|---|
| Pressure | 0.1 Pa to 100 pa |
| Applied power | 350 W |
| Treatment time | 10 minutes |

Third Embodiment

Figure 9A:
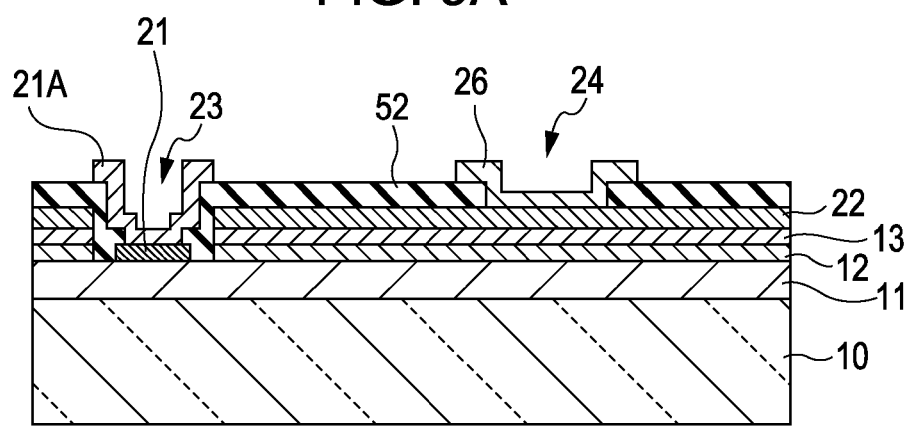
FIGS. 9A and 9B are schematic end views of a light-emitting device according to a third embodiment of the present invention, taken along the same arrows as IA-IA and IB-IB, respectively, in FIG. 2.
Figure 9B:
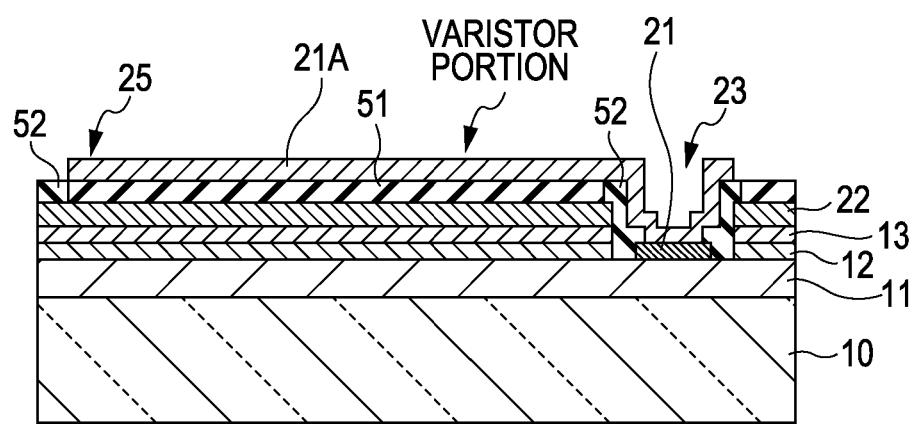
Figure 12B:
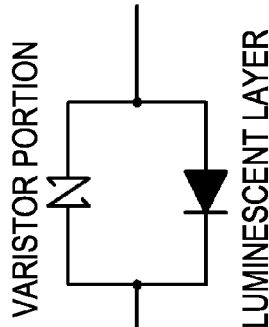

The third embodiment is a modification of the second embodiment. In the second embodiment, the first portion 41 of the insulating layer is composed of a barium titanate layer which is a high-dielectric material so that the portion of the first electrode extension 21A which is positioned on the insulating layer, the first portion 41 of the insulating layer, and the second electrode 22 form a capacitor portion. On the other hand, in the third embodiment, as shown in FIGS. 9A and 9B which are schematic end views taken along the same arrows as IA-IA and IB-IB in FIG. 2 and FIG. 12B which is a drawing of an equivalent circuit, a first portion 51 of the insulating layer is composed of a semiconductor ceramic layer, specifically strontium titanate ($SrTiO_3$) so that the portion of the first electrode extension 21A which is positioned on the insulating layer, the first portion 51 of the insulating layer, and the second electrode 22 form a varistor portion.

Except the above-described points, the light-emitting diode of the third embodiment may have the same constitution and structure as the light-emitting diode of the first embodiment. Therefore, detailed description of the light-emitting diode of the third embodiment is omitted. The method for manufacturing the light-emitting diode of the third embodiment is substantially the same as that for manufacturing the light-emitting diode of the second embodiment except that the first portion of the insulating layer is composed of a different material. Therefore, detailed description of the method is omitted.

Figure 10A:
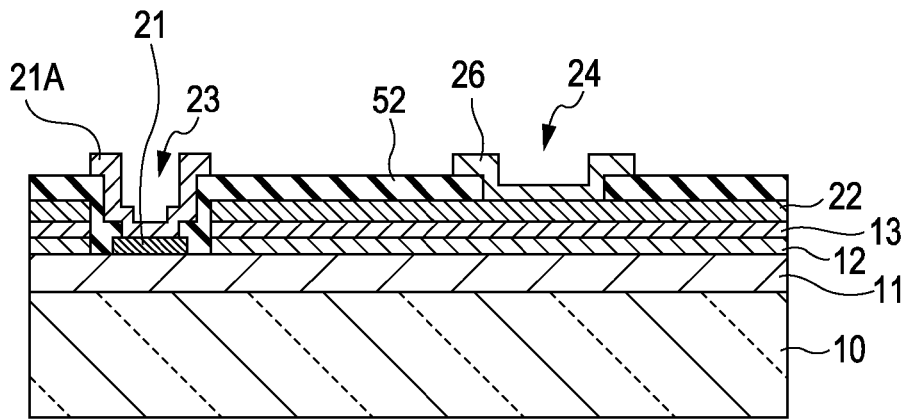
FIGS. 10A and 10B are schematic end views of a light-emitting device according to a modified example of the second embodiment of the present invention, taken along the same arrows as IA-IA and IB-IB, respectively, in FIG. 2.
Figure 10B:
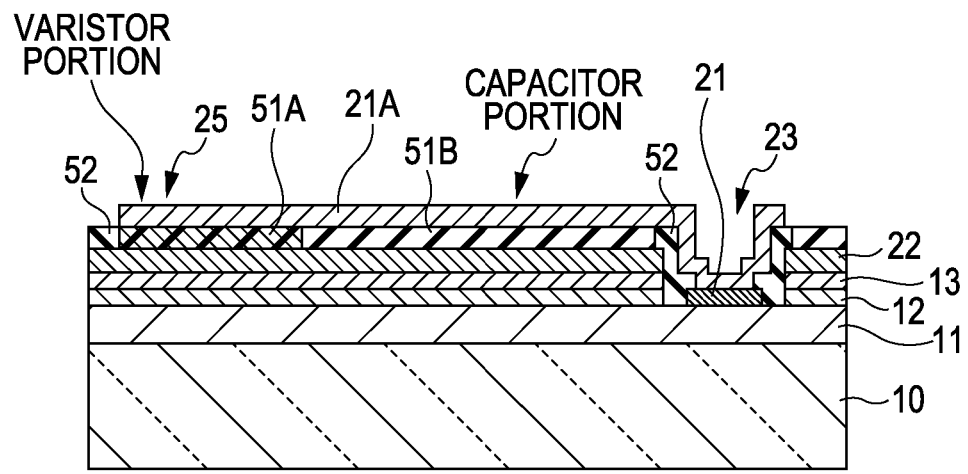
Figure 12C:
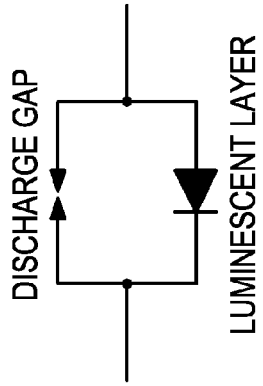
Figure 12D:
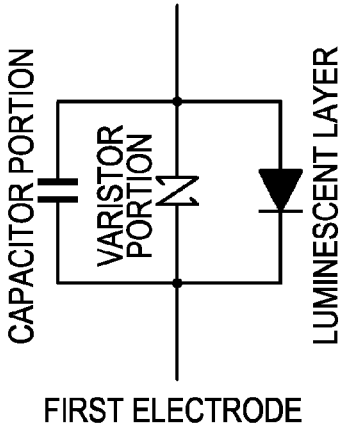

A light-emitting diode of a modified example of the third embodiment is shown in FIGS. 10A and 10B which are schematic end views taken along the same arrows as IA-IA and IB-IB in FIG. 2 and FIG. 12D which is a drawing of an equivalent circuit. In this modified example, an insulating layer includes a first portion provided between the first electrode extension 21A positioned on the insulating layer and the second electrode 22 and a second portion 52 provided in the other region. However, the first portion of the insulating layer includes a first portion 51A and a second portion 51B. The first portion 51A is disposed below the first pad portion, and the first portion 51B is disposed in the other region. The first portion 51A is composed of strontium titanate ($SrTiO_3$) so that the first pad portion 25, the first portion 51A of the insulating layer, and the second electrode 22 form a varistor portion. On the other hand, the first electrode extension 21A, the first portion 51B of the insulating layer, and the second electrode 22 form a capacitor portion.

Fourth Embodiment

Figure 11:
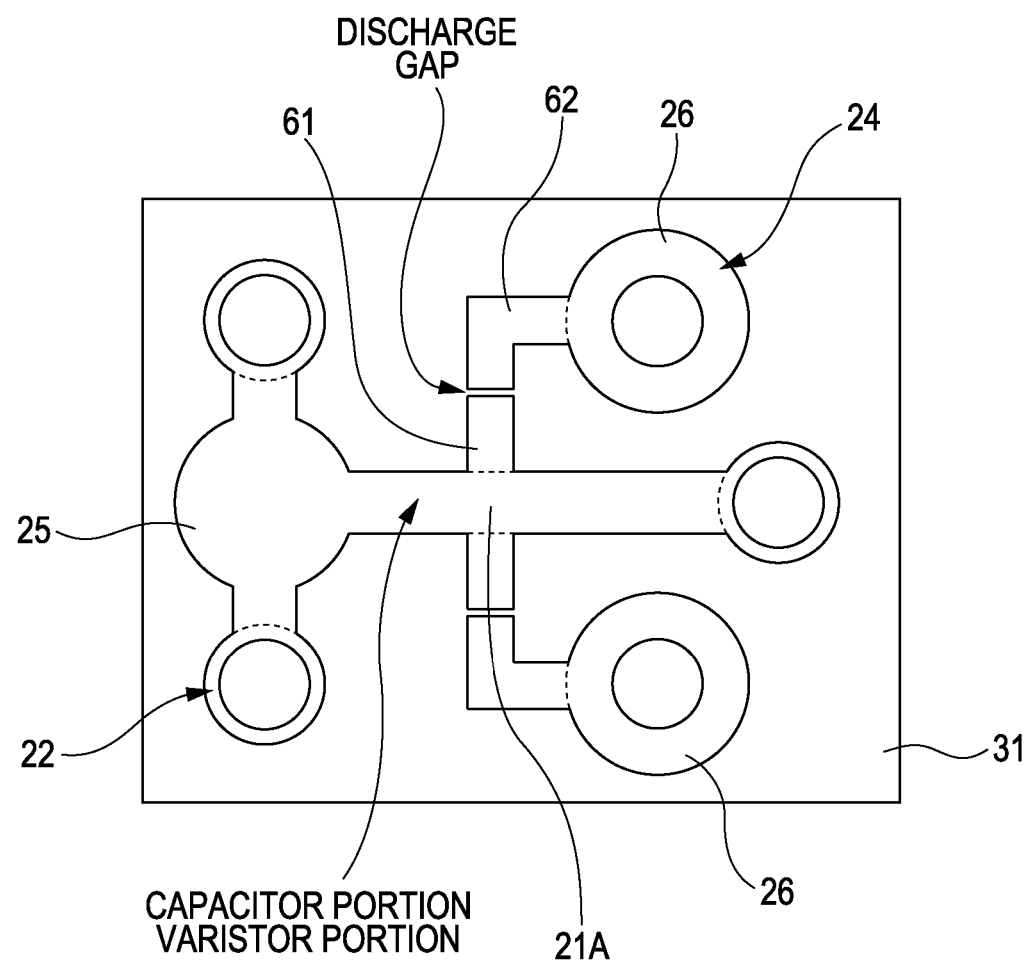
FIG. 11 is a schematic plan view of a light-emitting device (light-emitting diode) according to a fourth embodiment of the present invention.
Figure 12E:
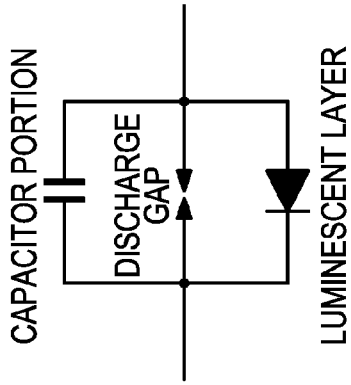

The fourth embodiment is a modification of the first or second embodiment. In the fourth embodiment, as shown in FIG. 11 which is a schematic plan view and FIG. 12E which is a drawing of an equivalent circuit, a first discharge electrode portion 61 extending from the first electrode extension 21A on the insulating layer 31 and a second discharge electrode portion 62 extending from each of the second pad portions 26 on the insulating layer 31 are further provided so that the ends of the first and second discharge electrode portions 61 and 62 are opposed to each other to form discharge gaps. In this constitution, the ends of the first and second discharge electrode portions 61 and 62 have the function as a so-called discharge tube. The first and second discharge electrode portions 61 and 62 are composed of a refractory metal material (e.g., tungsten). The distance of each discharge gap (the distance between the ends of the first and second discharge electrode portions 61 and 62) is 10 μm or less, specifically 1 μm. In FIG. 11, a capacitor portion or a varistor portion which will be described below is shown by oblique lines from upper right to lower left and the first and second discharge electrode portions 61 and 62 are shown by oblique lines from upper left to lower right.

The light-emitting diode of the fourth embodiment can be manufactured by, for example, the following method: In succession to step-170 of the first embodiment, the first and second discharge electrode portions 61 and 62 are formed on the insulating layer 31 by the lift-off method. Specifically, a resist layer is formed over the entire surface, and an opening is formed in a portion of the resist layer in which each of the first and second discharge electrode portions 61 and 62 is to be formed on the insulating layer 31. Then, a tungsten layer is formed over the entire surface by the sputtering method. Then the resist layer is removed to form the first and second discharge electrode portions 61 and 62 on the insulating layer 31. At this time, the first and second discharge electrode portions 61 and 62 are formed in a continuous state. Therefore, laser processing is then performed to form the ends of the first and second discharge electrode portions 61 and 62, thereby forming discharge gaps. Alternatively, the discharge gaps may be formed in the lift-off method so that the process can be further simplified.

Except the above-described points, the light-emitting diode of the fourth embodiment may have the same constitution and structure as the light-emitting diode of the first embodiment. Therefore, detailed description of the light-emitting diode of the fourth embodiment is omitted.

Figure 12F:
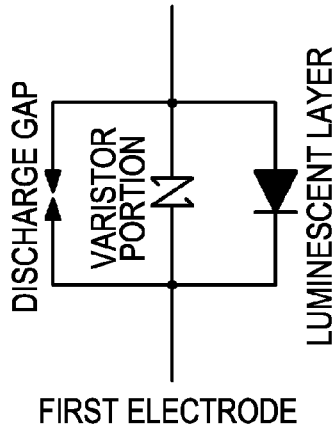
Figure 12G:
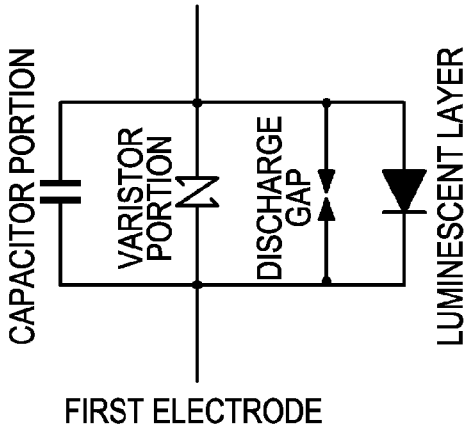

Further, the light-emitting diode of the fourth embodiment may be combined with the light-emitting diode of the third embodiment (drawing of an equivalent circuit: refer to FIG. 12F) or combined with the light-emitting diode of the modified example of the third embodiment (drawing of an equivalent circuit: refer to FIG. 12G). Even when the insulating layer 31 is made of a material having low dielectric constant ∈ to provide a capacitor portion having not so large capacitance, the high function to prevent electrostatic breakdown can be exhibited by adding the function as a so-called discharge tube to the light-emitting diode as in the fourth embodiment (drawing of an equivalent circuit: refer to FIG. 12C).

Although the present invention are described above on the basis of the preferred embodiments, the present invention is not limited to these embodiments. The constitution and structure of the light-emitting device, the constituent materials of the light-emitting device, and the manufacture conditions and various values of the light-emitting device described in each of the embodiments are only examples and can be appropriately changed. Although, in the embodiments, the first electrodes are provided at three positions, the first electrode may be provided at a position at the center of the light-emitting diode. In the first embodiment, in succession to step-170, for example, a SOG layer may be formed over the entire surface except on the first and second pad portions 25 and 26, resulting in further improvement in the reliability of the insulating layer 31.

Figure 14:
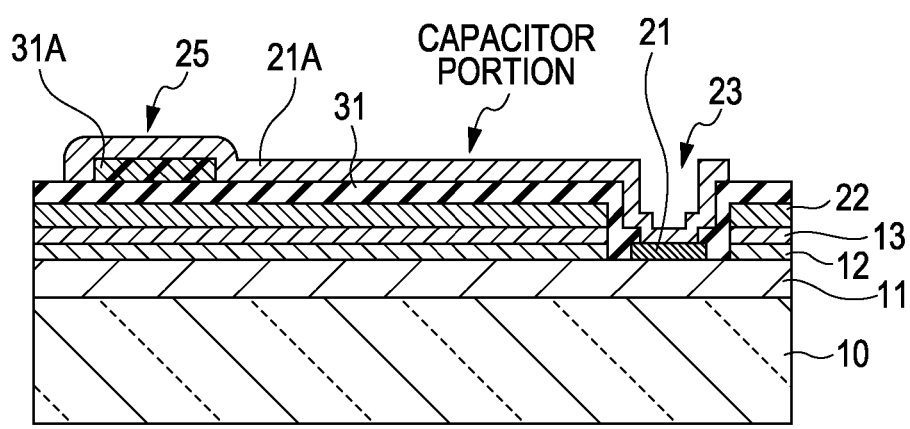
FIG. 14 is a schematic end view of a light-emitting device (light-emitting diode) according to a modified example of the first embodiment of the present invention, taken along arrow IB-IB in FIG. 2.

FIG. 14 is a schematic end view of a light-emitting element (light-emitting diode) of a modified example of the first embodiment, taken along line IB-IB in FIG. 2. Like in the second embodiment, in this light-emitting diode, the insulating layer 31 includes a SOG layer. On the other hand, like in the insulating layer 31 of the first embodiment, a portion 31A of the insulating layer immediately below the first pad portion 25 is composed of barium titanate ($BaTiO_3$), and the portion 31A of the insulating layer is covered with the first pad portion 25. Namely, in this modified example, the first portion of the insulating layer 31 has a multilayer structure.

According to circumstances, the substrate 10 may be removed or separated. Specifically, the substrate 10 may be removed or separated by laser ablation method, a heating method, or an etching method to expose the first compound semiconductor layer 11. Alternatively, the exposed first compound semiconductor layer may be subjected to various types of processing to provide various light-emitting device components (e.g., wiring) on the exposed first compound semiconductor layer.

It should be understood by those skilled in the art that various modifications, combinations, sub-combinations and alterations may occur depending on design requirements and other factors insofar as they are within the scope of the appended claims or the equivalents thereof.

What is claimed is:

1. A light-emitting device comprising:
   (A) a first compound semiconductor layer of a first conductivity type, an active layer, and a second compound semiconductor layer of a second conductivity type different from the first conductivity type being consecutively formed on a substrate;
   (B) a second electrode formed on and covering the second compound semiconductor layer;
   (C) an insulating layer covering the second electrode;
   (D) a first opening provided to pass through the insulating layer, the second electrode, the second compound semiconductor layer, and the active layer and expose the first compound semiconductor layer at the bottom of the first opening;
   (E) a second opening provided to pass through the insulating layer and expose the second electrode spaced from the top of the second opening and at the bottom of the second opening;
   (F) a first electrode formed on the exposed portion of the first compound semiconductor layer at the bottom of the first opening;
   (G) a first electrode extension extending from the first electrode to the insulating layer through the first opening and a first pad portion including a portion of the first electrode extension on the insulating layer; and
   (H) a second pad portion connected to the exposed portion of the second electrode at the bottom of the second opening and having portions formed along a side surface of the insulating layer and on a top surface of the insulating layer.

2. The light-emitting device according to claim 1, wherein a plurality of first electrodes is provided.

3. The light-emitting device according to claim 2, wherein the plurality of first electrodes is arranged in rotational symmetry with respect to a normal line passing through the center of the light-emitting device or arranged in symmetry with respect to a virtual plane including the normal line.

4. The light-emitting device according to claim 2, wherein first electrode extensions extending from the plurality of first electrodes are combined to form a first pad portion.

5. The light-emitting device according to claim 4, wherein a plurality of second pad portions is provided.

6. The light-emitting device according to claim 5, wherein two second pad portions are provided and arranged symmetrically with respect to a virtual plane including the center of the light-emitting device and passing through the center of the first pad portion.

7. The light-emitting device according to claim 2, wherein the distance from one of the first electrodes to the closest first electrode is $3\times10^{-4}$ m or less.

8. The light-emitting device according to claim 2, wherein the plurality of first electrodes includes three electrodes provided at three positions, the first electrode extension connects the three electrodes to form the first pad portion.

9. The light-emitting device according to claim 8, wherein the second pad portion includes two second pad portions arranged symmetrically with respect to a virtual plane passing through a center of the first pad portion and including a normal line passing through a center of the light-emitting device.

10. The light-emitting device according to claim 1, wherein the insulating layer includes a first portion provided between a portion of the first electrode extension which is positioned on the insulating layer and the second electrode and a second portion provided in the other region.

11. The light-emitting device according to claim 10, wherein the dielectric constant ∈ of a constituent material of at least the first portion of the insulating layer is $1\times10^1$ or more.

12. The light-emitting device according to claim 11, wherein the constituent material of at least the first portion of the insulating layer is at least one material selected from the group consisting of titanium oxide, lead-based relaxer ceramics, and $TiO_3$-based ceramics.

13. The light-emitting device according to claim 11, wherein the capacity of a capacitor formed by the first electrode extension disposed on the insulating layer, the first portion of the insulating layer, and the second electrode is $1\times10^{-12}$ F or more.

14. The light-emitting device according to claim 10, wherein the first portion of the insulating layer includes a semiconductor ceramic layer, and the first electrode extension disposed on the insulating layer, the first portion of the insulating layer, and the second electrode form a varistor portion.

15. The light-emitting device according to claim 14, wherein the constituent material of the semiconductor ceramic layer is at least one selected from the group consisting of zinc oxide, strontium titanate, and silicon carbide.

16. The light-emitting device according to claim 10, wherein the constituent material of the second portion of the insulating layer is SOG.

17. The light-emitting device according to claim 1, further comprising a first discharge electrode portion extending from the first electrode extension on the insulating layer and a second discharge electrode portion extending from the second pad portion on the insulating layer, wherein the ends of the first discharge electrode portion and the second discharge electrode portion are opposed to each other to form a discharge gap.

18. The light-emitting device according to claim 17, wherein the first discharge electrode portion and the second discharge electrode portion are composed of a refractory metal material or graphite.

19. The light-emitting device according to claim 1, wherein the insulating layer extends on the sidewall of the first opening, and the first electrode extension extends from the first electrode to the insulating layer through the extension of the insulating layer on the sidewall of the first opening.

20. The light-emitting device according to claim 19, wherein the first compound semiconductor layer, the active layer, and the second compound semiconductor layer are composed of a group III-V compound semiconductor containing at least gallium as a group III element and at least nitrogen as a group V element.

21. The light-emitting device according to claim 1, wherein the first electrode and the first electrode extension are separately formed using separate members.

22. The light-emitting device according to claim 1, wherein the substrate is formed of sapphire and an underlying layer of GaN formed on the sapphire.

23. The light-emitting device according to claim 22, wherein a current is passed from the second electrode to the first compound semiconductor layer and the first electrode through the second compound semiconductor layer and the active layer, a quantum well structure in the active layer is excited by injection of the current to create a light emission state to emit light through the substrate.

24. The light-emitting device according to claim 1, wherein the first pad portion and the second pad portion including a plating layer improving bonding, a protective layer is provided between the second electrode and the insulating layer.

25. The light-emitting device according to claim 1, wherein the portion of the first electrode extension on the insulating layer, the insulating layer, and the second electrode form a capacitor portion.

26. The light-emitting device according to claim 25, wherein the capacitor portion has an electro-static breakdown strength equivalent to or higher than the electro-static breakdown strength of a luminescent layer to prevent electro-static discharge breakdown of the light-emitting device.

27. The light-emitting device according to claim 26, wherein a capacity of the capacitor portion 120 pF to 300 pF.

28. The light-emitting device according to claim 1, wherein the second electrode covers an entire top surface of the second compound semiconductor.

* * * * *